(12) United States Patent
Takahashi

(10) Patent No.: US 11,309,235 B2
(45) Date of Patent: Apr. 19, 2022

(54) SEMICONDUCTOR MODULE, ELECTRONIC DEVICE, AND PRINTED WIRING BOARD

(71) Applicant: CANON KABUSHIKI KAISHA, Tokyo (JP)

(72) Inventor: Hideto Takahashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/901,117

(22) Filed: Jun. 15, 2020

(65) Prior Publication Data

US 2020/0411424 A1 Dec. 31, 2020

(30) Foreign Application Priority Data

Jun. 25, 2019 (JP) .............................. JP2019-117123

(51) Int. Cl.
| | | |
|---|---|---|
| *H01L 23/02* | (2006.01) | |
| *H01L 23/498* | (2006.01) | |
| *H01L 23/31* | (2006.01) | |

(52) U.S. Cl.
CPC .. *H01L 23/49816* (2013.01); *H01L 23/49833* (2013.01); *H01L 23/3128* (2013.01)

(58) Field of Classification Search
CPC ........... H01L 23/3128; H01L 23/49811; H01L 23/49816; H01L 23/49833; H01L 23/49838; H01L 24/10
USPC ...................................................... 257/678
See application file for complete search history.

(56) References Cited

U.S. PATENT DOCUMENTS

| | | | | |
|---|---|---|---|---|
| 7,183,652 B2* | 2/2007 | Waidhas | ............. | H01L 23/3128 257/772 |
| 7,687,803 B2* | 3/2010 | Takagi | ................. | G01R 1/0491 257/48 |
| 8,243,462 B2* | 8/2012 | Shibuya | ............... | H05K 1/0271 361/760 |
| 9,237,647 B2* | 1/2016 | Yew | .................. | H01L 23/49838 |

FOREIGN PATENT DOCUMENTS

| | | |
|---|---|---|
| JP | 2003-8191 A | 1/2003 |
| JP | 2010-245455 | 10/2010 |

OTHER PUBLICATIONS

Japanese Office Action issued in corresponding Japanese Application No. 2019-117123 dated Oct. 26, 2021 (English translation included).

* cited by examiner

*Primary Examiner* — Theresa T Doan
(74) *Attorney, Agent, or Firm* — Venable LLP

(57) ABSTRACT

A semiconductor module includes a printed wiring board and a semiconductor device. The printed wiring board includes a plurality of lands bonded to the semiconductor device via solder, and a solder resist. The plurality of lands includes a first land positioned in a vicinity of an outer edge of the insulating substrate and including a first edge portion, a second edge portion, a third edge portion, and a fourth edge portion. The first edge portion and the second edge portion are configured not to overlap with the solder resist and the third edge portion and the fourth edge portion are configured to overlap with the solder resist.

16 Claims, 12 Drawing Sheets of the printed wiring board. The impact of drop may cause a land of the printed wiring board to peel off from the insulating substrate of the printed wiring board. To solve this problem, Japanese Patent Application Publication No. 2010-245455 describes a substrate that has solder mask defined (SMD) pads (lands) and non-solder mask defined (NSMD) pads (lands).

SEMICONDUCTOR MODULE, ELECTRONIC DEVICE, AND PRINTED WIRING BOARD

BACKGROUND OF THE INVENTION

Field of the Invention

The present invention relates to a technology for a printed wiring board on which a semiconductor device is mounted.

Description of the Related Art

An electronic device includes a semiconductor module. The semiconductor module includes a semiconductor device, and a printed wiring board on which the semiconductor device is mounted. The printed wiring board includes an insulating substrate and lands formed on the insulating substrate. The lands of the printed wiring board are bonded to the semiconductor device via solder bonding portions.

If the electronic device is dropped, the impact of drop of the electronic device is applied to the semiconductor module. The impact of drop may cause a land of the printed wiring board to peel off from the insulating substrate of the printed wiring board. To solve this problem, Japanese Patent Application Publication No. 2010-245455 describes a substrate that has solder mask defined (SMD) pads (lands) and non-solder mask defined (NSMD) pads (lands).

As semiconductor devices are downsized, solder bonding portions tend to be made smaller. Thus, even with the structure of the lands described in Japanese Patent Application Publication No. 2010-245455, since the solder bonding portions are made smaller, a solder bonding portion that is in contact with an outer land of a plurality of lands may peel off from the land, or may fracture in normal use of the electronic device. For this reason, further improvement has been desired for increasing reliability of semiconductor modules.

SUMMARY OF THE INVENTION

According to a first aspect of the present invention, a semiconductor module includes a printed wiring board and a semiconductor device mounted on the printed wiring board. The printed wiring board includes an insulating substrate, a plurality of lands disposed on a main surface of the insulating substrate and bonded to the semiconductor device via solder, and a solder resist disposed on the main surface of the insulating substrate and configured to cover one portion of each of the plurality of lands. The plurality of lands includes a first land positioned in a vicinity of an outer edge of the insulating substrate in a plan view and including a first edge portion, a second edge portion, a third edge portion, and a fourth edge portion. In a first direction passing through the first land and a center of the semiconductor device, the first edge portion is positioned at one edge of the first land and the second edge portion is positioned at another edge of the first land, in the plan view. In a second direction orthogonal to the first direction, the third edge portion is positioned at one edge of the first land and the fourth edge portion is positioned at another edge of the first land, in the plan view. In the plan view, the first edge portion and the second edge portion are configured not to overlap with the solder resist and the third edge portion and the fourth edge portion are configured to overlap with the solder resist.

According to a second aspect of the present invention, a semiconductor module includes a printed wiring board and a semiconductor device mounted on the printed wiring board. The printed wiring board includes an insulating substrate, a plurality of lands disposed on a main surface of the insulating substrate and bonded to the semiconductor device via solder, and a solder resist disposed on the main surface of the insulating substrate and configured to cover one portion of each of the plurality of lands. The plurality of lands includes a first land positioned in a vicinity of an outer edge of the insulating substrate in a plan view and including a main-land portion and a sub-land portion formed independently from the main-land portion. In a first direction passing through the first land and a center of the semiconductor device, the main-land portion is positioned closer to the center of the semiconductor device than the sub-land portion, in the plan view. In the plan view, the main-land portion is configured not to overlap with the solder resist. In the plan view, a center portion of the sub-land portion is configured not to overlap with the solder resist and both edge portions of the sub-land portion positioned so as to hold the center portion, in a second direction orthogonal to the first direction, are configured to overlap with the solder resist.

According to a third aspect of the present invention, a printed wiring board on which a semiconductor device is mounted, the printed wiring board includes an insulating substrate, a plurality of lands disposed on a main surface of the insulating substrate and bonded to the semiconductor device via solder, and a solder resist disposed on the main surface of the insulating substrate and configured to cover one portion of each of the plurality of lands. The plurality of lands includes a first land positioned outside in a plan view and including a first edge portion, a second edge portion, a third edge portion, and a fourth edge portion. In a first direction passing through the first edge portion and a center of a mounting area in which the semiconductor device is mounted, the first edge portion is positioned at one edge of the first land and the second edge portion is positioned at another edge of the first land, in the plan view. In a second direction orthogonal to the first direction, the third edge portion is positioned at one edge of the first land and the fourth edge portion is positioned at another edge of the first land, in the plan view. In the plan view, the first edge portion and the second edge portion are configured not to overlap with the solder resist and the third edge portion and the fourth edge portion are configured to overlap with the solder resist.

Further features of the present invention will become apparent from the following description of exemplary embodiments with reference to the attached drawings.

DESCRIPTION OF THE EMBODIMENTS

First Embodiment

Figure 1:
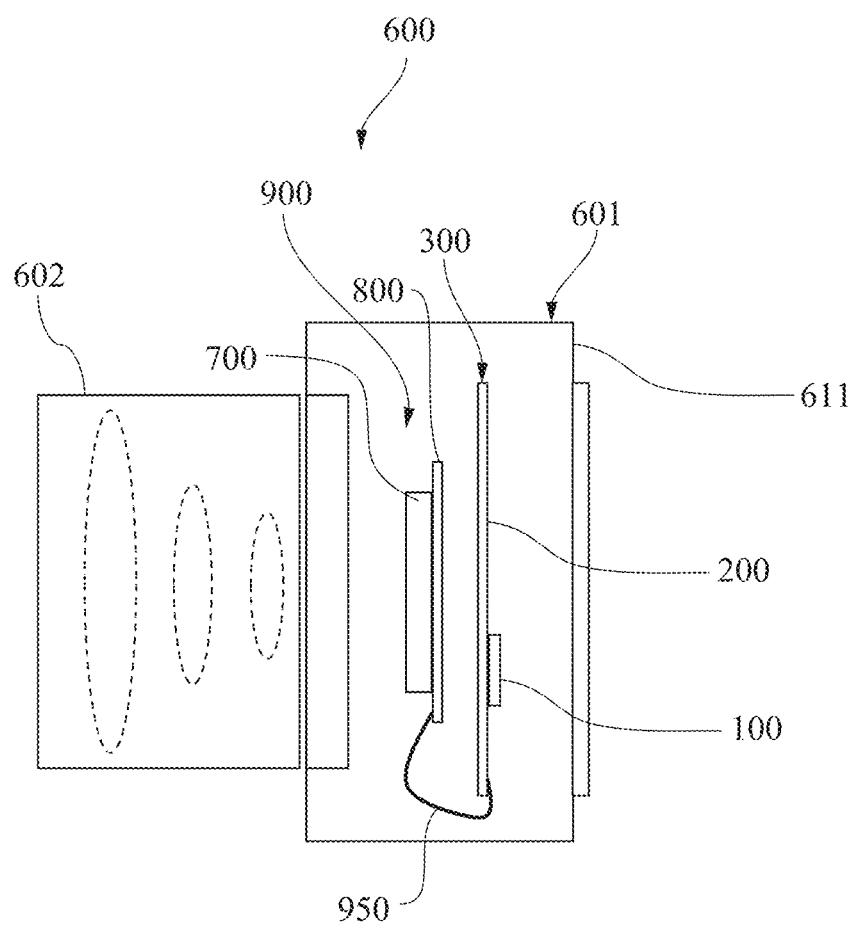
FIG. 1 is a diagram illustrating a digital camera, which is an image pickup device that serves as one example of an electronic device of a first embodiment.

Hereinafter, some embodiments of the present invention will be described in detail with reference to the accompanying drawings. FIG. 1 is a diagram illustrating a digital camera 600, which is an image pickup device that serves as one example of an electronic device of a first embodiment. The digital camera 600, which is an image pickup device, is a digital camera with interchangeable lenses; and includes a camera body 601. To the camera body 601, a lens unit (lens barrel) 602 including lenses is detachably attached. The camera body 601 includes a housing 611, a processing module 300, and a sensor module 900. The processing module 300 and the sensor module 900 are printed circuit boards disposed in the housing 611. The processing module 300 is one example of a semiconductor module. The processing module 300 and the sensor module 900 are electrically connected with each other via a cable 950.

The sensor module 900 includes an image sensor 700 that is an image pickup element, and a printed wiring board 800. The image sensor 700 is mounted on the printed wiring board 800. The image sensor 700 may be a complementary metal oxide semiconductor (CMOS) image sensor or a charge coupled device (CCD) image sensor. The image sensor 700 has a function that converts the light having passed through the lens unit 602, to an electric signal.

The processing module 300 includes a semiconductor device 100 and a printed wiring board 200. The semiconductor device 100 is mounted on the printed wiring board 200. The printed wiring board 200 is a rigid board. The semiconductor device 100 may be a digital signal processor; and has a function to receive an electrical signal from the image sensor 700, correct the electrical signal, and create image data.

Figure 2A:
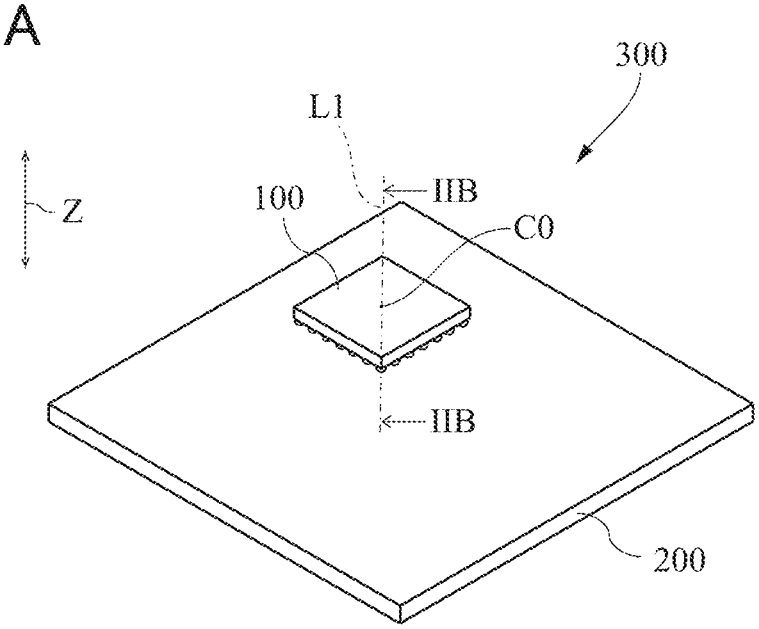
FIG. 2A is a perspective view of a processing module of the first embodiment.
Figure 2B:
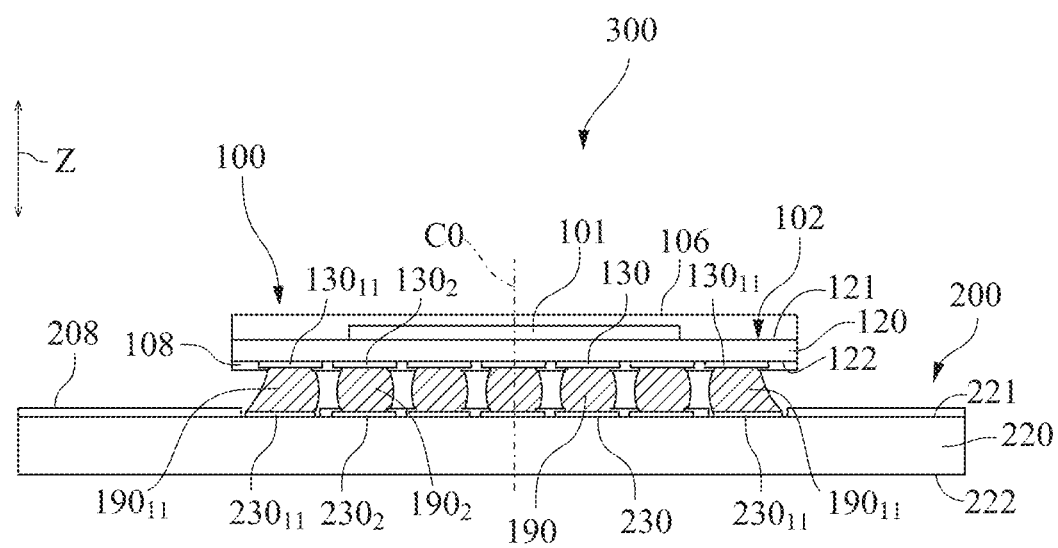
FIG. 2B is a schematic diagram of a cross section of the processing module.
Figure 3A:
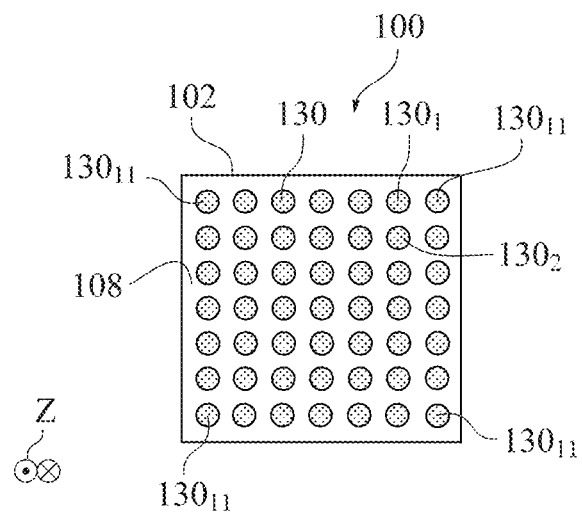
FIG. 3A is a plan view of a semiconductor device of the first embodiment.
Figure 3B:
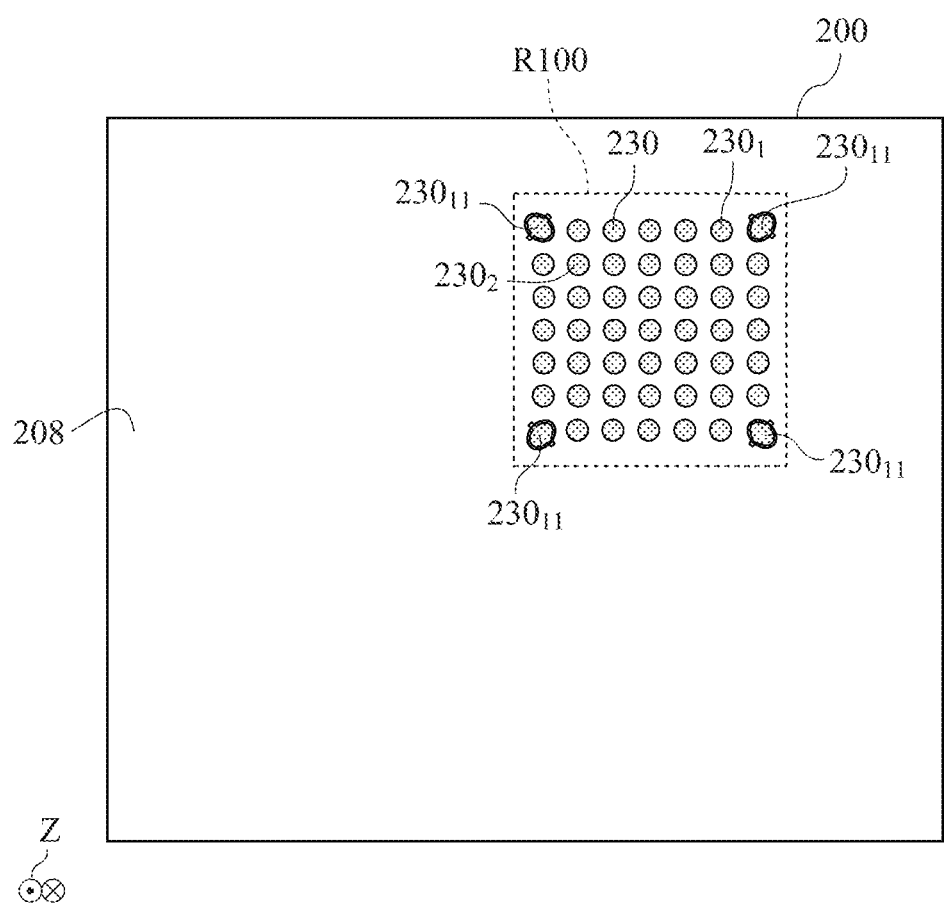
FIG. 3B is a plan view of a printed wiring board of the first embodiment.

FIG. 2A is a perspective view of the processing module 300 of the first embodiment. FIG. 2B is a schematic diagram of a cross section of the processing module 300, taken along a line IIB-IIB. Specifically, FIG. 2B schematically illustrates the cross section of the processing module 300 of FIG. 2A, taken along a straight line L1 passing through a center C0 of the semiconductor device 100. The center C0 of the semiconductor device 100 is located at a center of the semiconductor device 100 when the processing module 300 of FIG. 2A is viewed from a Z direction perpendicular to the mounting surface of the printed wiring board 200. That is, the center C0 of the semiconductor device 100 is located at the center of the semiconductor device 100 in a plan view of the processing module 300. When viewed from the Z direction, the semiconductor device 100 is rectangular. The straight line L1 passes through two opposite corners of the semiconductor device 100. FIG. 3A is a plan view of the semiconductor device 100 of the first embodiment. FIG. 3B is a plan view of the printed wiring board 200 of the first embodiment. Hereinafter, the description will be made with reference to FIGS. 2A, 2B, 3A, and 3B.

The semiconductor device 100 is an area-array semiconductor package. In the first embodiment, the semiconductor device 100 is a ball grid array (BGA) semiconductor package. Note that the semiconductor device 100 may be a land grid array (LGA) semiconductor package. The semiconductor device 100 includes a semiconductor element 101 and a package substrate 102. The package substrate 102 is a rigid substrate.

The semiconductor element 101 is mounted on the package substrate 102. The package substrate 102 includes an insulating substrate 120. The insulating substrate 120 has a main surface 121, and a main surface 122 opposite to the main surface 121. The material of the insulating substrate 120 may be ceramic such as alumina. The semiconductor element 101 may be a semiconductor chip, and is mounted on the main surface 121 of the insulating substrate 120 so as to face upward or downward. In the first embodiment, the semiconductor element 101 is mounted on the insulating substrate 120 so as to face downward. On the main surface 121 of the insulating substrate 120, a sealing resin 106 is formed for hermetically covering the semiconductor element 101. The package substrate 102 also includes a plurality of lands 130 disposed on the main surface 122 of the insulating substrate 120. The plurality of lands 130 are arranged in a checked pattern, that is, in a matrix. Note that the plurality of lands 130 may be arranged in a different pattern, such as in a staggered pattern. The lands 130 are terminals made of a metal material, such as copper or gold, that are electrically conductive; and each of the lands 130 serves as a signal terminal, a power terminal, a ground terminal, or a dummy terminal, for example. When viewed from the Z direction, the lands 130 are circular. On the main surface 122, a solder resist 108 is formed. The solder resist 108 is a film made of a solder resist material. One portion of each of the plurality of lands 130 is exposed by an opening formed in the solder resist 108. Each of the lands 130 may be a solder mask defined (SMD) land or a non-solder mask defined (NSMD) land, but preferably, is an SMD land. In the first embodiment, each of the lands 130 is an SMD land. Thus, the whole of the outer circumferential edge of each of the lands 130 is covered with the solder resist 108. Another portion of each of the lands 130, used for solder bonding, is exposed by an opening formed in the solder resist 108. The opening is circular in a plan view. Note that a heatsink may be disposed on a top surface of the semiconductor element 101 although not illustrated.

The printed wiring board 200 includes an insulating substrate 220. The insulating substrate 220 has a main surface 221, and a main surface 222 opposite to the main surface 221. Note that the Z direction is perpendicular to the main surfaces 121 and 122 of the insulating substrate 120, and to the main surfaces 221 and 222 of the insulating substrate 220. The printed wiring board 200 also includes a plurality of lands 230 disposed on the main surface 221 of the insulating substrate 220 and having the same number as that of the lands 130. The plurality of lands 230 are arranged in the same pattern as that of the plurality of lands 130. The lands 230 are terminals made of a metal material, such as copper or gold, that are electrically conductive; and each of the lands 230 serves as a signal terminal, a power terminal, a ground terminal, or a dummy terminal, for example. The material of the insulating substrate 220 is an insulating material, such as epoxy resin.

The printed wiring board 200 includes a solder resist 208. The solder resist 208 is a film made of a solder resist material. The solder resist 208 is formed on the main surface 221. One portion of each of the plurality of lands 230 is covered with the solder resist 208. Another portion of each of the lands 230, used for solder bonding, is exposed by an opening formed in the solder resist 208.

Figure 4A:
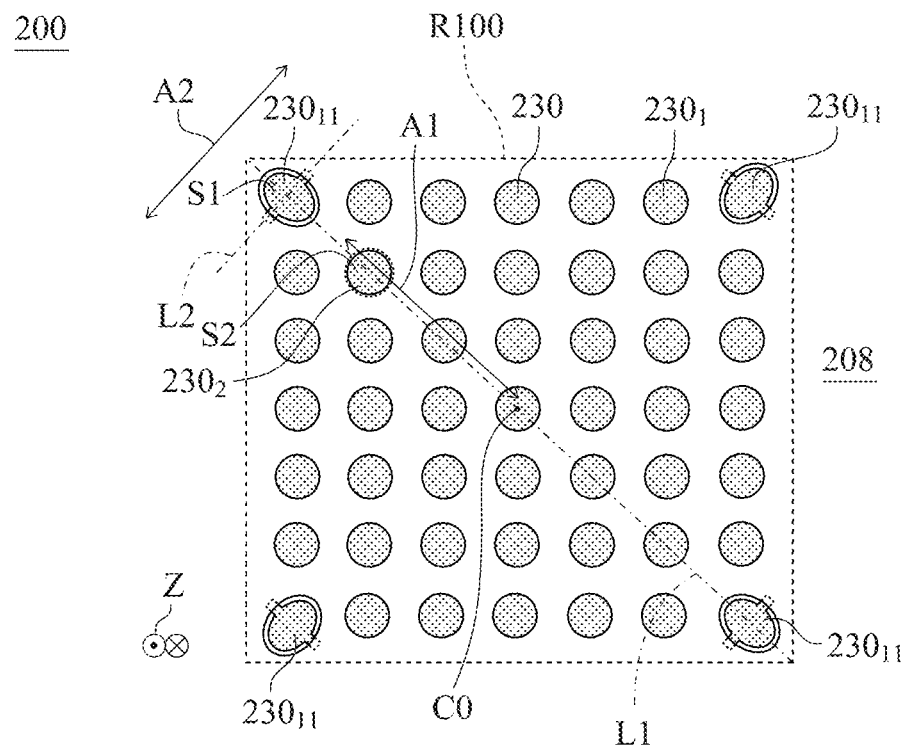
FIG. 4A is a plan view of a mounting area of the printed wiring board of the first embodiment.
Figure 4B:
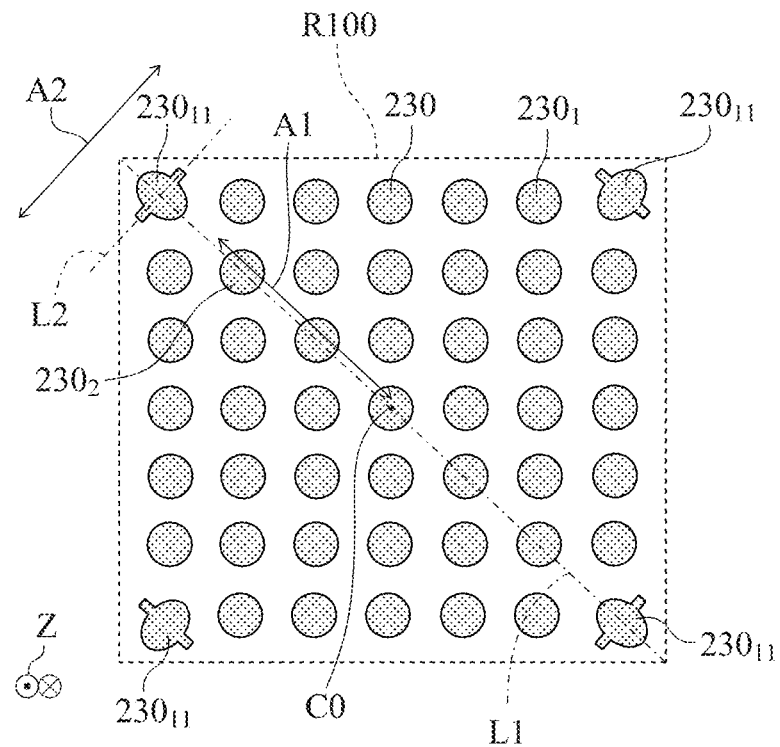
FIG. 4B is a plan view of the mounting area in which a solder resist is removed.

In FIG. 3B, a mounting area R100 on which the semiconductor device 100 is mounted is indicated by a broken line. FIG. 4A is a plan view in which the mounting area R100 of the printed wiring board 200, illustrated in FIG. 3B, is enlarged. FIG. 4B is a plan view in which the solder resist 208 is removed from the mounting area R100 of FIG. 4A.

The mounting area R100 is an area obtained when the semiconductor device 100 mounted on the printed wiring board 200 is projected onto the printed wiring board 200 in the Z direction. Thus, when viewed from the Z direction, the mounting area R100 has the same shape and size as those of the semiconductor device 100. Thus, when viewed from the Z direction, the mounting area R100 has the same rectangular shape as that of the semiconductor device 100.

A land 130 and a corresponding land 230 face each other in the Z direction, and are bonded to each other via a corresponding solder bonding portion 190 of FIG. 2B. The solder bonding portions 190 are made of solder. The lands 130 and the lands 230 are electrically and mechanically connected with each other via the solder bonding portions 190. The solder bonding portions 190 has the same number as that of the lands 130 or 230.

As illustrated in FIG. 3A, the plurality of lands 130 include lands $130_1$ positioned outside when viewed from the Z direction. Specifically, when viewed from the Z direction, the lands $130_1$ of the plurality of lands 130 are positioned on the outermost side and disposed along the outer edge of the semiconductor device 100. The lands $130_1$ include lands $130_{11}$ positioned at corner portions of the semiconductor device 100 when viewed from the Z direction. Since the semiconductor device 100 has four corner portions, the number of the lands $130_{11}$ is four. In addition, the plurality of lands 130 include lands $130_2$ positioned inside when viewed from the Z direction.

As illustrated in FIG. 3B, the plurality of lands 230 include lands $230_1$ positioned outside when viewed from the Z direction. Specifically, when viewed from the Z direction, the lands $230_1$ of the plurality of lands 230 are positioned on the outermost side and disposed on the insulating substrate 220 along the outer edge of the semiconductor device 100 of FIG. 2A. The lands $230_1$ include lands $230_{11}$ positioned closer to corner portions of the semiconductor device 100 than any other lands $230_1$ when viewed from the Z direction. Since the semiconductor device 100 has four corner portions, the number of the lands $230_{11}$ is four. In addition, the plurality of lands 230 include lands $230_2$ positioned inside when viewed from the Z direction. The lands $230_1$ are disposed along the outer edge of the mounting area R100 when viewed from the Z direction. The lands $230_{11}$ are disposed at the corner portions of the mounting area R100 when viewed from the Z direction. In FIGS. 4A and 4B, an A1 direction is defined as a direction in which a straight line extends while connecting lands $230_{11}$ and the center C0 of the semiconductor device 100, that is, as a direction along the straight line. In addition, an A2 direction is defined as a direction orthogonal to the A1 direction. In the first embodiment, the A1 direction is a direction along the previously-described straight line L1.

As illustrated in FIG. 2B, a land $130_{11}$ and a corresponding land $230_{11}$ face each other in the Z direction, via a corresponding solder bonding portion $190_{11}$. A land $130_2$ and a corresponding land $230_2$ face each other in the Z direction, via a corresponding solder bonding portion $190_2$. The solder bonding portion $190_{11}$ of the plurality of solder bonding portions 190 bonds the land $130_{11}$ and the land $230_{11}$. The solder bonding portion $190_2$ of the plurality of solder bonding portions 190 bonds the land $130_2$ and the land $230_2$. The land $230_{11}$ is a first land. The land $230_2$ is a second land. The land $130_{11}$ is a third land. The land $130_2$ is a fourth land.

The solder bonding portion $190_{11}$, which is positioned closer to the corner portion of the semiconductor device 100 than any other solder bonding portions, is required to have a bonding strength higher than that of the solder bonding portion $190_2$. Thus, for ensuring the bonding strength of the solder bonding portion $190_{11}$, the volume of the solder bonding portion $190_{11}$ is larger than that of the solder bonding portion $190_2$. In addition, as illustrated in FIG. 4A, when viewed from the Z direction, an area S1 of a surface of the land $230_{11}$ that does not overlap with the solder resist 208 is larger than an area S2 of a surface of the land $230_2$ that does not overlap with the solder resist 208.

The digital camera 600 illustrated in FIG. 1 is a mobile device carried by a user. Thus, the digital camera 600 may be unintentionally dropped. In this case, the impact of drop of the digital camera 600 is applied to the processing module 300. In particular, the impact of drop is applied to the lands $230_1$ of the plurality of lands 230. Among the lands $230_1$, the impact of drop tends to concentrate on the lands $230_{11}$.

To prevent the peeling of the lands $230_{11}$ caused by the impact of drop, the lands $230_{11}$ might be SMD lands. That is, the whole of the outer circumferential edge of each of the lands $230_{11}$ might be covered with the solder resist 208. However, the present inventors have found out that if the lands $230_{11}$ are simple SMD lands, the SMD lands will cause the following problem.

When a user uses the digital camera 600, the semiconductor device 100 operates and generates heat. When the semiconductor device 100 generates heat, the semiconductor device 100 expands in accordance with its coefficient of linear expansion. As a result, thermal stress is produced especially in solder bonding portions (of the plurality of solder bonding portions 190) that bond the lands $130_1$ and the lands $230_1$. In FIG. 2B, the semiconductor device 100 expands in the A1 direction, relative to the printed wiring board 200. Thus, among the solder bonding portions that bond the lands $130_1$ and the lands $230_1$, the thermal stress tends to concentrate on the solder bonding portions $190_{11}$ positioned at the corner portions, due to the operation of the semiconductor device 100.

If the lands $230_{11}$ are simple SMD lands, a solder bonding portion $190_{11}$ that is in contact with a land $230_{11}$ is also in contact with an edge of a wall of the solder resist 208. The wall of the solder resist 208 defines an opening that exposes the land $230_{11}$. The present inventors have found out that after the semiconductor device 100 repeatedly expands and contracts, due to heating and cooling, in the A1 direction, the solder bonding portion $190_{11}$ starts to peel off or fracture at a portion of the solder bonding portion $190_{11}$ that is in contact with an edge portion of the edge of the wall (that defines an opening). The edge portion of the edge of the wall is formed in the A1 direction.

In the first embodiment, one portion of each of the lands $230_{11}$ is covered with the solder resist 208 differently from other lands of the plurality of lands 230.

The other lands, such as the lands $230_2$, are SMD lands. Thus, the whole of the outer circumferential edge of each of the lands $230_2$ is covered with the solder resist 208. In FIG. 4A, a portion of a land $230_2$ that overlaps with the solder resist 208 is indicated by a broken line. Note that in the other lands $230_2$ except for the land $230_2$, a portion of each of the lands $230_2$ that overlaps with the solder resist 208 is not illustrated, or is not indicated by a broken line.

The lands other than the lands $230_{11}$ are circular when viewed from the Z direction. In addition, a portion of each of the other lands exposed from a corresponding opening of the solder resist 208 is circular when viewed from the Z direction. That is, a portion of each of the other lands that does not overlap with the solder resist 208 is circular when viewed from the Z direction.

In FIGS. 4A and 4B, the straight line L1 and the straight line L2 are each indicated by a dot-and-dash line. The straight line L1 passes through the center C0 of the semiconductor device 100, that is, the center C0 of the mounting area R100; and the straight line L2 is orthogonal to the straight line L1. The straight line L1 passes through two opposite corners of the mounting area R100. The A1 direction is a first direction in which the straight line L1 extends, and the A2 direction is a second direction in which the straight line L2 extends. In FIGS. 4A and 4B, among the seven lands 230 disposed along the straight line L1, the lands $230_{11}$ are positioned at outermost positions in the A1 direction, and the lands $230_2$ between the two lands $230_{11}$ are positioned at inner positions in the A1 direction.

Figure 5A:
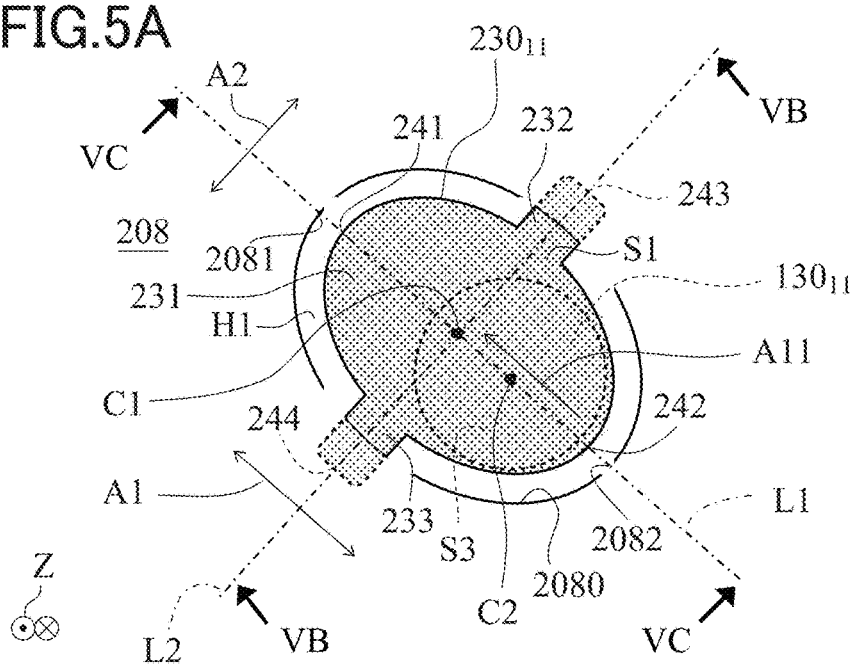
FIG. 5A is a plan view of a first land of the first embodiment.

Since the four lands $230_{11}$ illustrated in FIGS. 4A and 4B have an identical structure, the upper left land $230_{11}$ of the four lands $230_{11}$ will be described as an example FIG. 5A is a plan view in which the single land $230_{11}$ is enlarged. Specifically, FIG. 5A is a plan view in which the upper left land $230_{11}$ of the four lands $230_{11}$ illustrated in FIG. 4A is enlarged. In FIG. 5A, a broken-line circle indicates an outer circumferential edge of a portion of a land $130_{11}$ of the semiconductor device 100 of FIG. 3A. The portion of the land $130_{11}$ does not overlap with the solder resist 108, and is exposed from a corresponding opening of the solder resist 108.

The solder resist 208 includes a side wall 2080 that defines an opening H1. When viewed from the Z direction, the opening H1 has an elliptical shape whose major axis extends in the A1 direction and whose minor axis extends in the A2 direction. Most of the land $230_{11}$ is exposed by the opening H1.

The land $230_{11}$ includes a pair of edge portions 241 and 242, and a pair of edge portions 243 and 244. When viewed from the Z direction, the edge portions 241 and 242 face each other in the A1 direction, and the edge portions 243 and 244 face each other in the A2 direction. The edge portion 241, which is one of the edge portions 241 and 242, is a first edge portion; and the edge portion 242, which is the other, is a second edge portion. The edge portion 241 is positioned farther from the center C0 of the mounting area R100 of FIG. 4A than the edge portion 242, and the edge portion 242 is positioned closer to the center C0 of the mounting area R100 than the edge portion 241. The edge portion 243, which is one of the edge portions 243 and 244, is a third edge portion; and the edge portion 244, which is the other, is a fourth edge portion. When viewed from the Z direction, the pair of the edge portions 241 and 242 does not overlap with the solder resist 208, and the pair of the edge portions 243 and 244 overlaps with the solder resist 208.

Figure 5B:
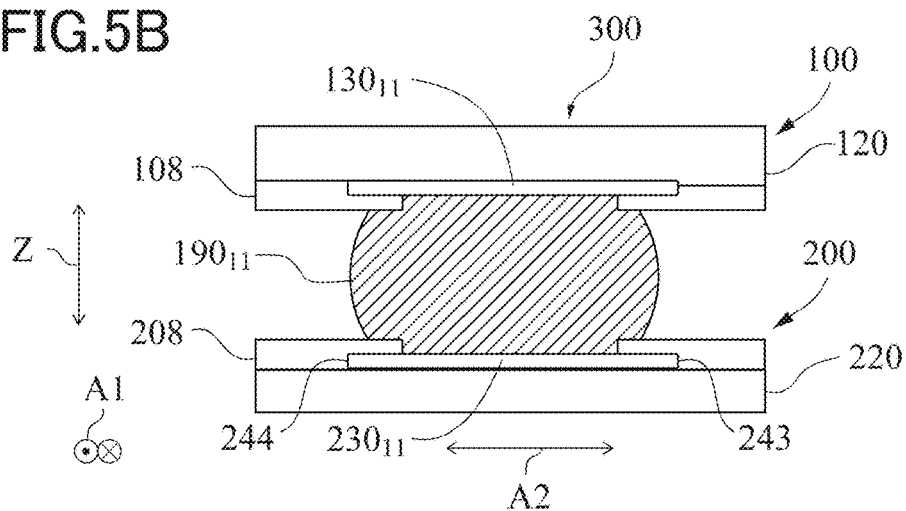
FIG. 5B is a partial cross-sectional view of the processing module of the first embodiment.
Figure 5C:
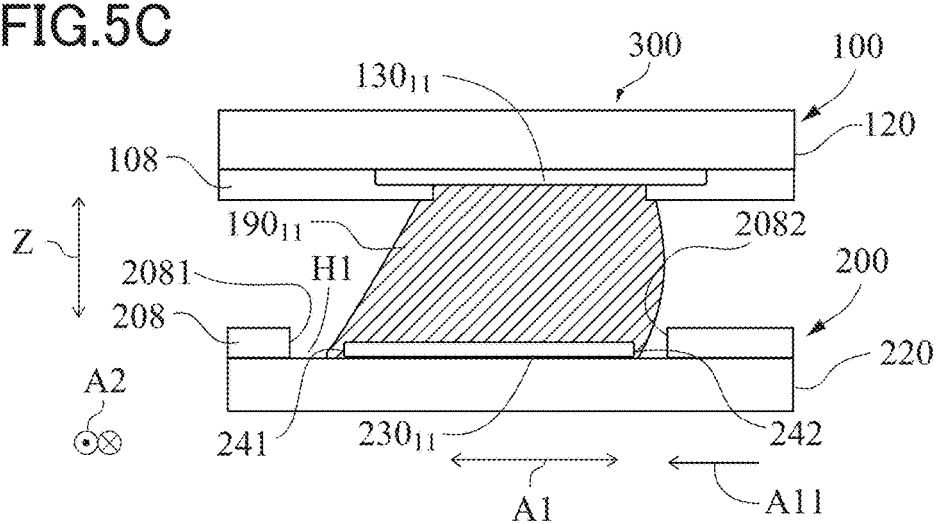
FIG. 5C is a partial cross-sectional view of the processing module of the first embodiment.

FIG. 5B is a cross-sectional view of the processing module 300, taken along a line VB-VB. FIG. 5C is a cross-sectional view of the processing module 300, taken along a line VC-VC. As illustrated in FIG. 5B, since the pair of the edge portions 243 and 244 is covered with the solder resist 208, the land $230_{11}$ is prevented from peeling off from the insulating substrate 220, by the solder resist 208.

In addition, as illustrated in FIG. 5C, since the pair of the edge portions 241 and 242 is exposed from the solder resist 208, the solder bonding portion $190_{11}$ is not in contact with both of edge portions 2081 and 2082 of the side wall 2080 of FIG. 5A. The edge portions 2081 and 2082 of the side wall 2080 are formed in the A1 direction. With this structure, the thermal stress caused by the thermal deformation of the semiconductor device 100 can be prevented from locally concentrating on the solder bonding portion $190_{11}$. As a result, the peeling and the fracture of the solder bonding portion $190_{11}$ can be prevented.

As illustrated in FIG. 5A, in the first embodiment, the land $230_{11}$ includes a land body 231. When viewed from the Z direction, the land body 231 has an elliptical shape whose major axis extends in the A1 direction and whose minor axis extends in the A2 direction. The land body 231 is smaller than the opening H1 of the solder resist 208. In the land body 231, the length in the A1 direction is larger than the length in the A2 direction. The land body 231 includes the pair of the edge portions 241 and 242. The land $230_{11}$ also includes a projecting portion 232 and a projecting portion 233. The projecting portion 232 is a first projecting portion that extends from the land body 231 toward one direction in the A2 direction. The projecting portion 233 is a second projecting portion that extends from the land body 231 toward the other direction in the A2 direction, opposite to the one direction in which the first projecting portion 232 extends. The projecting portion 232 includes the edge portion 243, and the projecting portion 233 includes the edge portion 244. The edge portion 243 is an edge portion of the projecting portion 232 in the A2 direction, and the edge portion 244 is an edge portion of the projecting portion 233 in the A2 direction. When viewed from the Z direction, the projecting portions 232 and 233 are rectangular. The width of the projecting portions 232 and 233 in the A1 direction is equal to or smaller than half the length of the land body 231 in the A1 direction.

In the first embodiment, when viewed from the Z direction, the edge portion of the projecting portion 232 overlaps with the solder resist 208, and the rest of the projecting portion 232 does not overlap with the solder resist 208. Similarly, when viewed from the Z direction, the edge portion of the projecting portion 233 overlaps with the solder resist 208, and the rest of the projecting portion 233 does not overlap with the solder resist 208. In addition, when viewed from the Z direction, the whole of the land body 231, that is, the portion of the land $230_{11}$ in which the projecting portions 232 and 233 are removed does not overlap with the solder resist 208.

The width of the projecting portions 232 and 233 in the A1 direction may be constant in the A2 direction, or may be gradually increased or decreased as the projecting portions 232 and 233 extends from the land body 231 in the A2 direction. The maximum width of the projecting portions 232 and 233 in the A1 direction may have any value as long as the value is equal to or smaller than the length of the land body 231 in the A1 direction. As the width of the projecting portions 232 and 233 increases in the A1 direction, the portion of the projecting portions 232 and 233, which is covered with the solder resist 208, increases. As a result, the peeling of the land $230_{11}$ is more effectively prevented. In view of this, the width of the projecting portions 232 and 233 in the A1 direction is preferably equal to or larger than 50 μm.

The length of the projecting portions 232 and 233 in the A2 direction may have any value as long as the edge portions of the projecting portions 232 and 233 are positioned underneath the solder resist 208. The projecting portions 232 and 233 are disposed so as not to interfere with other traces of the printed wiring board 200. For effectively preventing the peeling of the land $230_{11}$, it is preferable that the length of a portion of each of the projecting portions 232 and 233 that overlaps with the solder resist 208 is equal to or larger than 25 μm in the A2 direction.

By the way, for solder-bonding the semiconductor device to the printed wiring board 200 in the manufacturing process of the processing module 300, the semiconductor device 100 and the printed wiring board 200 are conveyed into a reflow furnace and exposed to an atmosphere whose temperature is equal to or larger than a solder melting point. In this process, the semiconductor device 100 mounted on the printed wiring board 200 thermally deforms, with being convex upward with respect to the printed wiring board 200. That is, the semiconductor device 100 thermally deforms such that a center portion of the semiconductor device 100 moves away from the printed wiring board 200 and corner portions of the semiconductor device 100 move close to the printed wiring board 200.

When the solder between the semiconductor device 100 and the printed wiring board 200 is heated to a temperature equal to or higher than the solder melting point and melted, the melted solder wets and spreads on the lands 130 of the semiconductor device 100 and the lands 230 of the printed wiring board 200, while held between the lands 130 and the lands 230. Note that as illustrated in FIG. 2B, a land $130_2$ and a corresponding land $230_2$ face each other in the Z direction such that a center of the land $130_2$ and a center of the land $230_2$ are aligned with each other.

As illustrated in FIG. 5A, a land $130_{11}$ and a corresponding land $230_{11}$ face each other in the Z direction. In the first embodiment, a center C1 of the land $230_{11}$ in the A1 direction is separated from a center C2 of the land $130_{11}$ in the A1 direction, toward an A11 direction extending away from the center C0 of the semiconductor device 100. With this arrangement, the melted solder wets and spreads on the land $230_{11}$ outward in the A1 direction, that is, in the A11 direction. Thus, the melted solder hardly swells in the lateral direction (A2 direction), and forms a fillet on the edge portion 241 of the land $230_{11}$. As a result, the solder bonding portion $190_{11}$ can be prevented from being short-circuited to other solder bonding portions around the solder bonding portion $190_{11}$, while ensuring sufficient bonding strength.

In addition, as illustrated in FIG. 5A, when viewed from the Z direction, an area S1 of a surface of the land $230_{11}$ that does not overlap with the solder resist 208 is larger than an area S3 of a surface of the land $130_{11}$ that does not overlap with the solder resist 108 of FIG. 5B. That is, when viewed from the Z direction, the whole of the surface of the land $130_{11}$ that does not overlap with the solder resist 108 overlaps with the surface of the land $230_{11}$ that does not overlap with the solder resist 208. Thus, as illustrated in FIG. 5C, the edge portion 241 of the land $230_{11}$ projects more in the A11 direction than the surface of the land $130_{11}$ that does not overlap with the solder resist 108. As a result, in the manufacturing process, the melted solder wets and spreads on the land $230_{11}$ until reaching the edge portion 241. Thus, the solder bonding portion $190_{11}$ can be effectively prevented from swelling in the lateral direction (A2 direction), and from being short-circuited to other solder bonding portions around the solder bonding portion $190_{11}$. The longer the length of the land body 231 in the A1 direction, the more effectively the solder bonding portion $190_{11}$ is prevented from being short-circuited to other solder bonding portions around the solder bonding portion $190_{11}$.

As described above, in the first embodiment, since the edge portions 241 and 242 of the land $230_{11}$ have an NSMD structure, the solder bonding portion $190_{11}$ can be prevented from peeling off from the land $230_{11}$ and from fracturing. In addition, since the edge portions 243 and 244 have an SMD structure, the land $230_{11}$ can be prevented from peeling off when the impact of drop of the digital camera 600 is applied to the processing module 300. Therefore, the reliability of the processing module 300 improves.

Modification

Figure 6:
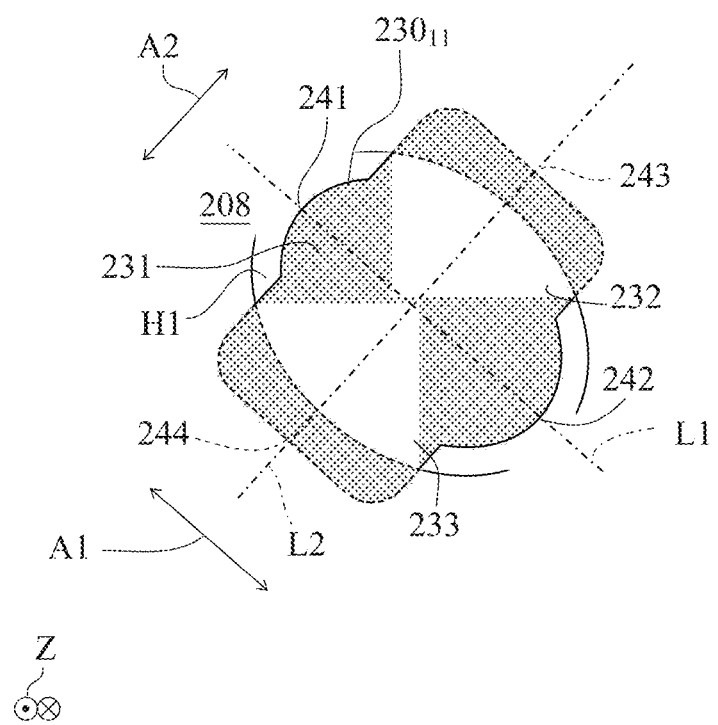
FIG. 6 is a plan view of a first land of a modification.

FIG. 6 illustrates a modification of the land $230_{11}$ described in the first embodiment. FIG. 6 is a plan view of a land $230_{11}$ of the modification. In the above-described first embodiment, as illustrated in FIG. 5A, the width of the projecting portions 232 and 233 in the A1 direction is equal to or smaller than half the length of the land body 231 in the A1 direction. However, the width of the projecting portions 232 and 233 in the A1 direction is not limited to this. As illustrated in FIG. 6, the width of the projecting portions 232 and 233 in the A1 direction may be larger than half the length of the land body 231 in the A1 direction.

Second Embodiment

Figure 7:
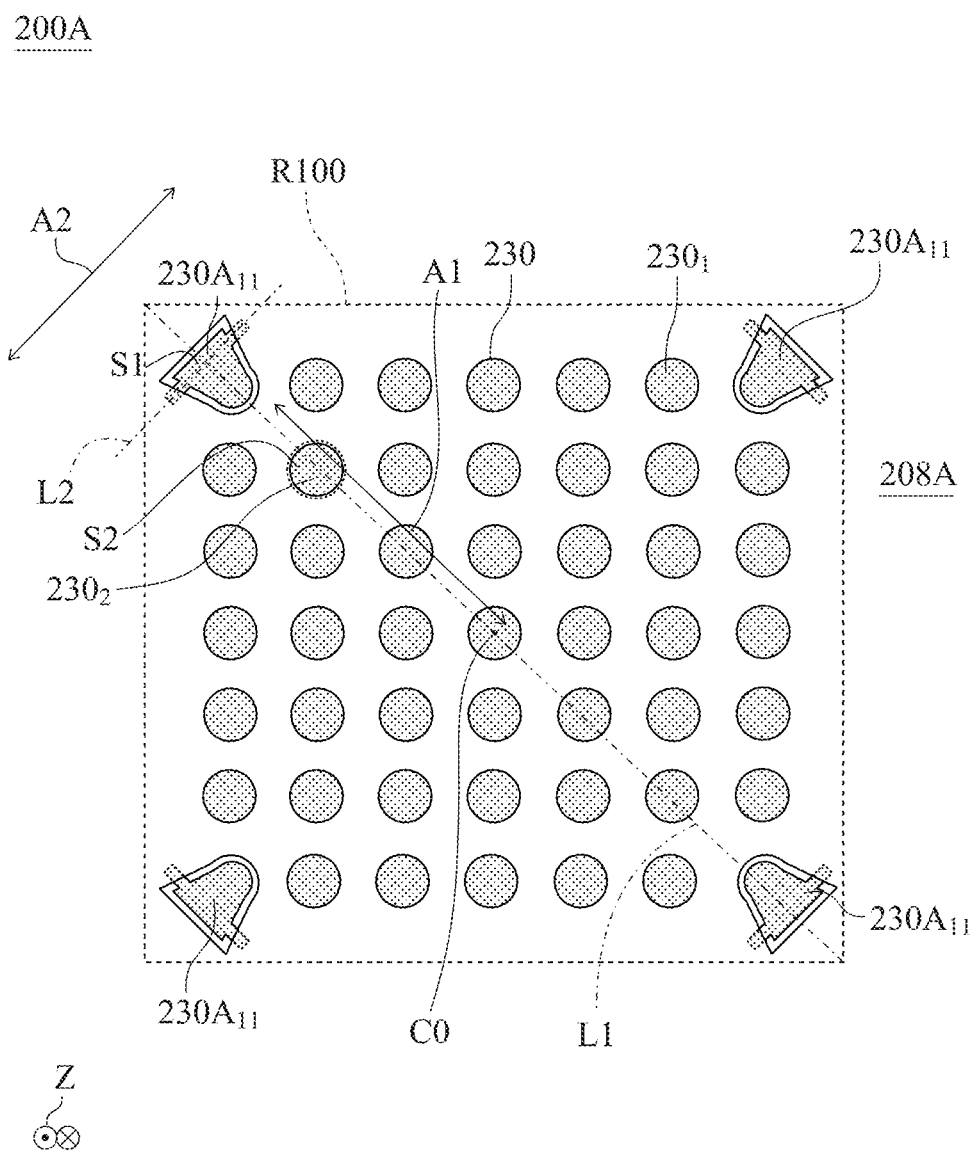
FIG. 7 is a plan view of a mounting area of a printed wiring board of a second embodiment.

Next, a second embodiment will be described. FIG. 7 is a plan view in which a mounting area R100 (on which the semiconductor device 100 is mounted) of a printed wiring board 200A of the second embodiment is enlarged. The printed wiring board 200A of the second embodiment includes a plurality of lands 230 arranged as in the first embodiment. The plurality of lands 230 includes lands $230A_{11}$ positioned in the vicinity of corner portions of the semiconductor device when viewed from the Z direction. The lands $230A_{11}$ are first lands. In the second embodiment, the shape of the lands $230A_{11}$ is different from the shape of the lands $230_{11}$ of the first embodiment. That is, in the second embodiment, the lands $230_{11}$ illustrated in FIG. 4A and described in the first embodiment are replaced by the lands $230A_{11}$ illustrated in FIG. 7. The printed wiring board 200A includes a solder resist 208A. The solder resist 208A is the same in material as the solder resist 208 of the first embodiment, but is different from the solder resist 208 of the first embodiment in the shape of the opening that exposes the land $230A_{11}$. Since the other configuration of the second embodiment is the same as that of the first embodiment, a component identical to a component of the first embodiment is given an identical symbol, and the description thereof will be omitted.

As illustrated in FIG. 7, the printed wiring board 200A includes four lands $230A_{11}$ positioned at corner portions of the mounting area R100, on which the semiconductor device is mounted. The four lands $230A_{11}$ have an identical shape, but have different orientations when viewed from the Z direction.

Figure 8A:
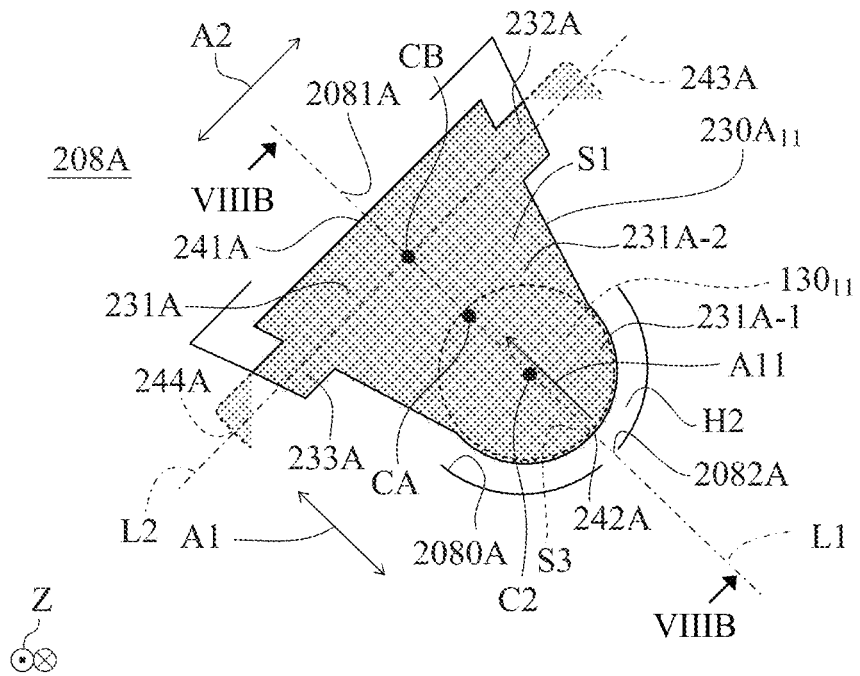
FIG. 8A is a plan view of a first land of the second embodiment.
Figure 8B:
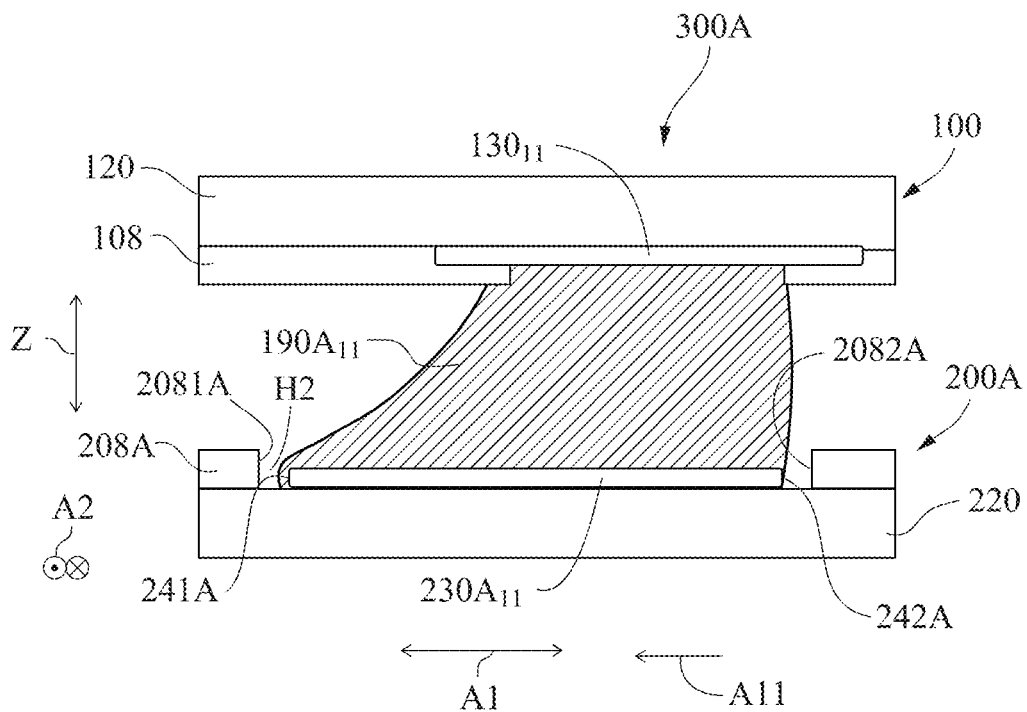
FIG. 8B is a partial cross-sectional view of a processing module of the second embodiment.

FIG. 8A is a plan view in which the upper left land $230A_{11}$ of the four lands $230A_{11}$ illustrated in FIG. 7 is enlarged. FIG. 8B is a cross-sectional view of a processing module 300A of the second embodiment, taken along a line VIIIB-VIIIB. In FIG. 8A, as in the first embodiment, a broken-line circle indicates an outer circumferential edge of a portion of a land $130_{11}$ of the semiconductor device 100 of FIG. 8B. The portion of the land $130_{11}$ does not overlap with the solder resist 108 of the semiconductor device 100, and is exposed from a corresponding opening of the solder resist 108.

The processing module 300A of the second embodiment illustrated in FIG. 8B is one example of a semiconductor module mounted on an electronic device, and includes the semiconductor device 100 and the above-described printed wiring board 200A. The semiconductor device 100 is mounted on the printed wiring board 200A. The printed wiring board 200A includes an insulating substrate 220, as in the first embodiment. A land $130_{11}$ and a corresponding land $230A_{11}$ are bonded to each other via a corresponding solder bonding portion $190A_{11}$.

As illustrated in FIG. 7, the land $230A_{11}$ is made larger than the land $230_2$, as in the first embodiment. That is, when viewed from the Z direction, an area S1 of a surface of the land $230A_{11}$ that does not overlap with the solder resist 208A is larger than an area S2 of a surface of the land $230_2$ that does not overlap with the solder resist 208A. As a result, the solder bonding portion $190A_{11}$ of FIG. 8B positioned at a corner portion of the semiconductor device has sufficient bonding strength.

In the second embodiment, one portion of each of the lands $230A_{11}$ is covered with the solder resist 208A differently from other lands of the plurality of lands 230. The other lands, such as the lands $230_2$, are SMD lands as described in the first embodiment.

As illustrated in FIG. 8A, the solder resist 208A includes a side wall 2080A that defines an opening H2. Most of the land $230A_{11}$ is exposed by the opening H2.

The land $230A_{11}$ includes a pair of edge portions 241A and 242A, and a pair of edge portions 243A and 244A. When viewed from the Z direction, the edge portions 241A and 242A face each other in the A1 direction, and the edge portions 243A and 244A face each other in the A2 direction. The edge portion 241A, which is one of the edge portions 241A and 242A, is a first edge portion; and the edge portion 242A, which is the other, is a second edge portion. The edge portion 241A is positioned farther from the center C0 of the mounting area R100 of FIG. 7 than the edge portion 242A, and the edge portion 242A is positioned closer to the center C0 of the mounting area R100 than the edge portion 241A. The edge portion 243A, which is one of the edge portions 243A and 244A, is a third edge portion; and the edge portion 244A, which is the other, is a fourth edge portion. When viewed from the Z direction, the pair of the edge portions 241A and 242A does not overlap with the solder resist 208A, and the pair of the edge portions 243A and 244A overlaps with the solder resist 208A.

As illustrated in FIG. 8A, since the pair of the edge portions 243A and 244A is covered with the solder resist 208A, the land $230A_{11}$ is prevented from peeling off from the insulating substrate 220 of the printed wiring board 200A of FIG. 8B, by the solder resist 208A.

In addition, as illustrated in FIG. 8B, the pair of the edge portions 241A and 242A is exposed from the solder resist 208A. Thus, the solder bonding portion $190A_{11}$ that bonds the land $130_{11}$ and the land $230A_{11}$ is not in contact with both of edge portions 2081A and 2082A of the side wall 2080A of FIG. 8A. The edge portions 2081A and 2082A of the wall 2080A are formed in the A1 direction. With this structure, the thermal stress caused by the thermal deformation of the semiconductor device 100 can be prevented from locally concentrating on the solder bonding portion $190A_{11}$. As a result, the peeling and the fracture of the solder bonding portion $190A_{11}$ can be prevented.

In the second embodiment, as illustrated in FIG. 8A, the land $230A_{11}$ includes a land body 231A. When viewed from the Z direction, the land body 231A is smaller than the opening H2 of the solder resist 208A. The length of the land body 231A in the A1 direction is larger than the length of the land body 231A in the A2 direction. The land body 231A includes the pair of the edge portions 241A and 242A. The center of the land $230A_{11}$ in the A1 direction is identical to the center of the land body 231A in the A1 direction, and the center is referred to as a center CA.

The land $230A_{11}$ includes a projecting portion 232A and a projecting portion 233A. The projecting portion 232A is a first projecting portion that extends from the land body 231A toward one direction in the A2 direction. The projecting portion 233A is a second projecting portion that extends from the land body 231A toward the other direction in the A2 direction, opposite to the one direction in which the first projecting portion 232A extends. The projecting portion 232A includes the edge portion 243A, and the projecting portion 233A includes the edge portion 244A. When viewed from the Z direction, the projecting portions 232A and 233A are rectangular. The edge portion 243A is an edge portion of the projecting portion 232A in the A2 direction, and the edge portion 244A is an edge portion of the projecting portion 233A in the A2 direction.

In the second embodiment, when viewed from the Z direction, the edge portion of the projecting portion 232A overlaps with the solder resist 208A, and the rest of the projecting portion 232A does not overlap with the solder resist 208A. Similarly, when viewed from the Z direction, the edge portion of the projecting portion 233A overlaps with the solder resist 208A, and the rest of the projecting portion 233A does not overlap with the solder resist 208A. In addition, when viewed from the Z direction, the land body 231A, that is, the portion of the land $230A_{11}$ in which the projecting portions 232A and 233A are removed does not overlap with the solder resist 208A.

As illustrated in FIG. 8A, a land $130_{11}$ and a corresponding land $230A_{11}$ face each other in the Z direction. In the second embodiment, as in the first embodiment, the center CA of the land $230A_{11}$ in the A1 direction is separated from the center C2 of the land $130_{11}$ in the A1 direction, toward the A11 direction extending away from the center C0 of the mounting area R100 of FIG. 7. As a result, the solder bonding portion $190A_{11}$ that is in contact with the land $230A_{11}$ can be prevented from being short-circuited to other solder bonding portions around the solder bonding portion $190A_{11}$, while ensuring sufficient bonding strength.

In addition, as illustrated in FIG. 8A, when viewed from the Z direction, an area S1 of a surface of the land $230A_{11}$ that does not overlap with the solder resist 208A is larger than an area S3 of a surface of the land $130_{11}$ that does not overlap with the solder resist 108. That is, when viewed from the Z direction, the whole of the surface of the land $130_{11}$ that does not overlap with the solder resist 108 overlaps with the surface of the land $230A_{11}$ that does not overlap with the solder resist 208A. Thus, as illustrated in FIG. 8B, when viewed from the Z direction, the edge portion 241A of the land 230A$_{11}$ projects more in the A11 direction than the surface of the land 130$_{11}$ that does not overlap with the solder resist 108. As a result, in the manufacturing process, the melted solder wets and spreads on the land 230A$_{11}$ until reaching the edge portion 241A. Thus, the solder bonding portion 190A$_{11}$ can be effectively prevented from swelling in the lateral direction (A2 direction), and from being short-circuited to other solder bonding portions around the solder bonding portion 190A$_{11}$. The longer the length of the land body 231A in the A1 direction, the more effectively the solder bonding portion 190A$_{11}$ is prevented from being short-circuited to other solder bonding portions around the solder bonding portion 190A$_{11}$.

As illustrated in FIG. 8A, when viewed from the Z direction, the land body 231A widens outward in the A1 direction. Specifically, when viewed from the Z direction, the land body 231A widens in the A11 direction extending away from the center C0 of the mounting area R100 of FIG. 7. The land body 231A includes a semicircular portion 231A-1 and a trapezoidal portion 231A-2 disposed downstream of the semicircular portion 231A-1 in the A11 direction. When viewed from the Z direction, the semicircular portion 231A-1 is semicircular, and the trapezoidal portion 231A-2 is trapezoidal. The diameter of the semicircular portion 231A-1 is nearly equal to the diameter of the land 130$_{11}$. The edge portion 241A is on the side of the long side of the trapezoidal portion 231A-2. A portion of the trapezoidal portion 231A-2 on the side of the short side joins with the semicircular portion 231A-1. The length of the edge portion 241A in the A2 direction is larger than the diameter of the land 130$_{11}$.

Since the land body 231A widens outward, the melted solder easily wets and spreads on the land body 231A toward the edge portion 241A in the manufacturing process of the processing module 300A. Thus, as illustrated in FIG. 8B, the solder bonding portion 190A$_{11}$ forms a fillet on the edge portion 241A. As a result, the solder bonding portion 190A$_{11}$ can be further suppressed from swelling in the A2 direction, and can be more effectively prevented from being short-circuited to other solder bonding portions around the solder bonding portion 190A$_{11}$.

The land tends to start to peel off at one edge portion of the land. The one edge portion of the land is formed in the A1 direction and farther from the center C0 of the mounting area R100 of FIG. 7, than the other edge portion of the land formed in the A1 direction. In the second embodiment, however, when viewed from the Z direction, the projecting portions 232A and 233A are positioned farther from the center C0 of the mounting area R100 of FIG. 7 than the center CA of the land body 231A in the A1 direction. In addition, a center CB between the projecting portions 232A and 233A is positioned farther from the center C0 of the mounting area R100 of FIG. 7 than the center CA in the A1 direction. Thus, the peeling of the land 230A$_{11}$ can be effectively suppressed.

As described above, in the second embodiment, since the edge portions 241A and 242A of the land 230A$_{11}$ have an NSMD structure, the solder bonding portion 190A$_{11}$ can be prevented from peeling off from the land 230A$_{11}$ and from fracturing. In addition, since the edge portions 243A and 244A have an SMD structure, the land 230A$_{11}$ can be prevented from peeling off when the impact of drop of the digital camera 600 is applied to the processing module 300A. Therefore, the reliability of the processing module 300A improves.

Third Embodiment

Figure 9A:
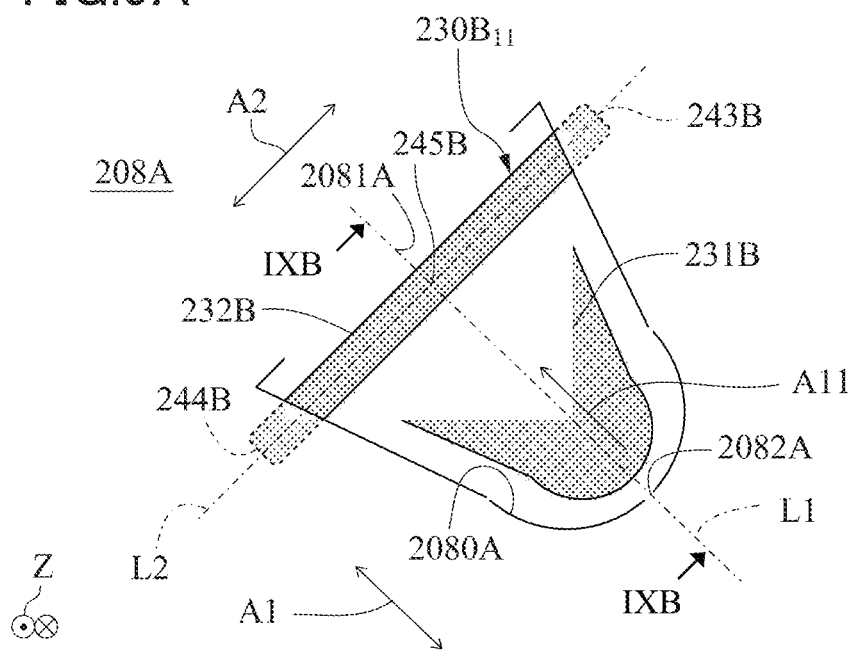
FIG. 9A is a plan view of a first land of a third embodiment.
Figure 9B:
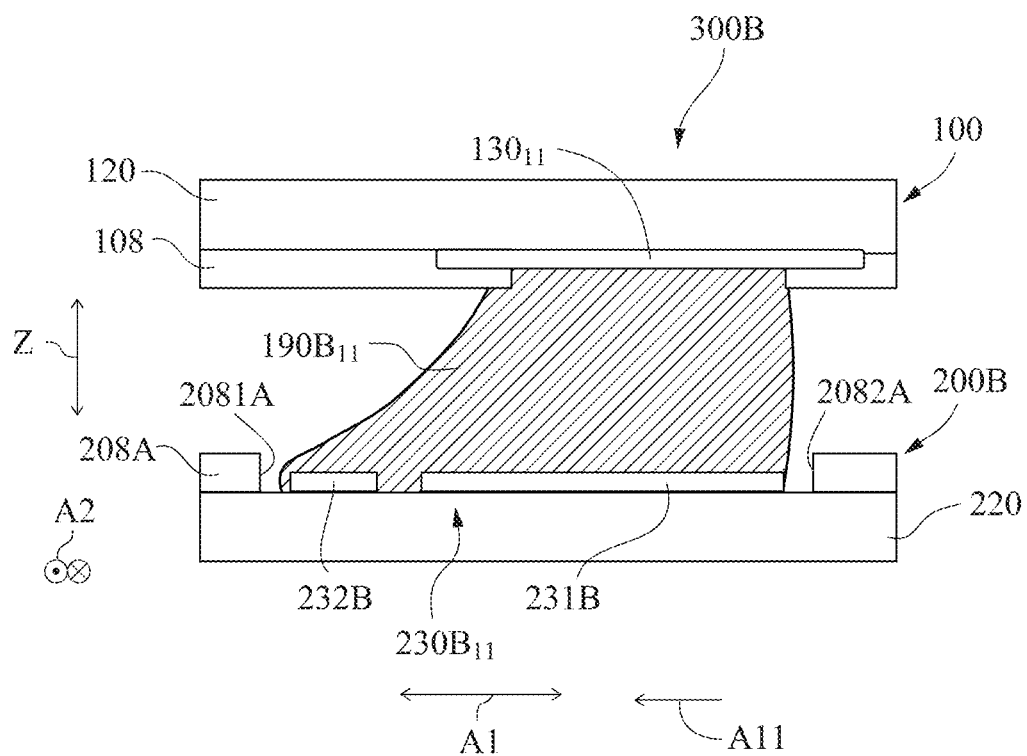
FIG. 9B is a partial cross-sectional view of a processing module of the third embodiment.

Next, a third embodiment will be described. FIG. 9A is a plan view of a land 230B$_{11}$ of the third embodiment. FIG. 9B is a cross-sectional view of a processing module 300B of the third embodiment, taken along a line IXB-IXB. In the third embodiment, the land 230B$_{11}$ is a first land, and is different from the land 230A$_{11}$ of the second embodiment in shape and structure. Since the other configuration of the third embodiment is the same as that of the second embodiment, a component identical to a component of the second embodiment is given an identical symbol, and the description thereof will be omitted. Note that the shape of the opening of the solder resist is the same as that of the second embodiment.

The processing module 300B of the third embodiment illustrated in FIG. 9B is one example of a semiconductor module mounted on an electronic device, and includes the semiconductor device 100 and a printed wiring board 200B. The semiconductor device 100 is mounted on the printed wiring board 200B. The printed wiring board 200B includes lands 230B$_{11}$. In addition, the printed wiring board 200B includes the insulating substrate 220 and the solder resist 208A, as in the second embodiment. A land 130$_{11}$ of the semiconductor device 100 and a corresponding land 230B$_{11}$ of the printed wiring board 200B are bonded to each other via a corresponding solder bonding portion 190B$_{11}$.

The land 230B$_{11}$ includes two land portions 231B and 232B. The two land portions 231B and 232B are independent from each other, that is, separated from each other. The two land portions 231B and 232B are electrically connected with the land 130$_{11}$ via the single solder bonding portion 190B$_{11}$.

The land 230B$_{11}$ includes a main-land portion 231B. In addition, the land 230B$_{11}$ includes a sub-land portion 232B that is independent from the main-land portion 231B. When viewed from the Z direction, the sub-land portion 232B is disposed outward with respect to the main-land portion 231B in the A1 direction. That is, the sub-land portion 232B is disposed at a position positioned farther from the center of the semiconductor device 100 in the A11 direction.

When viewed from the Z direction, the whole of the main-land portion 231B does not overlap with the solder resist 208A. When viewed from the Z direction, the sub-land portion 232B is rectangular, and the length of the sub-land portion 232B in the A2 direction is larger than the length of the sub-land portion 232B in the A1 direction. The sub-land portion 232B includes a pair of edge portions 243B and 244B, and a center portion 245B. When viewed from the Z direction, the edge portions 243B and 244B and the center portion 245B are disposed in the A2 direction. When viewed from the Z direction, the center portion 245B does not overlap with the solder resist 208A, and the pair of the edge portions 243B and 244B overlaps with the solder resist 208A.

Since the pair of the edge portions 243B and 244B of the sub-land portion 232B is covered with the solder resist 208A, the land 230B$_{11}$ is prevented from peeling off from the insulating substrate 220 of the printed wiring board 200B, by the solder resist 208A.

As described above, the whole of the main-land portion 231B and the center portion 245B of the sub-land portion 232B are exposed from the solder resist 208A. Thus, the solder bonding portion 190B$_{11}$ is not in contact with both of edge portions 2081A and 2082A of the side wall 2080A of the solder resist 208A. With this structure, the thermal stress caused by the thermal deformation of the semiconductor device 100 can be prevented from locally concentrating on the solder bonding portion $190B_{11}$. As a result, the peeling and the fracture of the solder bonding portion $190B_{11}$ can be prevented. Therefore, the reliability of the processing module 300B improves.

Fourth Embodiment

Figure 10A:
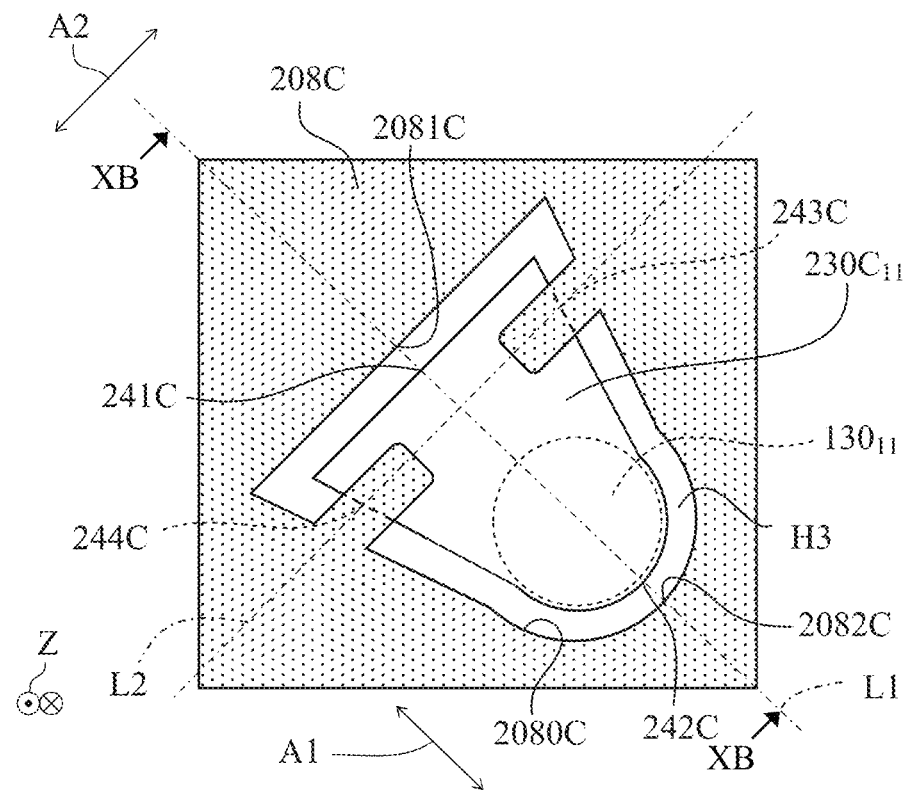
FIG. 10A is a plan view of a first land of a fourth embodiment.
Figure 10B:
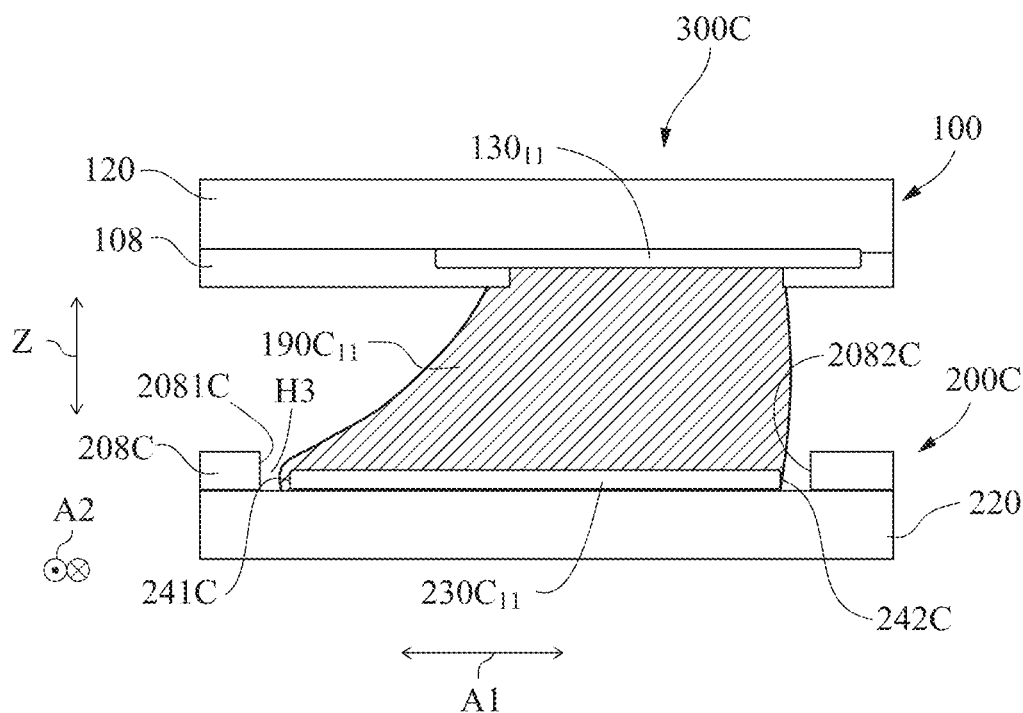
FIG. 10B is a partial cross-sectional view of a processing module of the fourth embodiment.

Next, a fourth embodiment will be described. FIG. 10A is a plan view of a land $230C_{11}$ of the fourth embodiment. FIG. 10B is a cross-sectional view of a processing module 300C of the fourth embodiment, taken along a line XB-XB. In the fourth embodiment, the land $230C_{11}$ is a first land, and is different from the land $230B_{11}$ of the third embodiment in shape and structure. In addition, the shape of the opening of the solder resist is different from that of the third embodiment. Since the other configuration of the fourth embodiment is the same as that of the third embodiment, a component identical to a component of the third embodiment is given an identical symbol, and the description thereof will be omitted.

The processing module 300C of the fourth embodiment illustrated in FIG. 10B is one example of a semiconductor module mounted on an electronic device, and includes the semiconductor device 100 and a printed wiring board 200C. The semiconductor device 100 is mounted on the printed wiring board 200C. The printed wiring board 200C includes lands $230C_{11}$, the insulating substrate 220, and a solder resist 208C. A land $130_{11}$ of the semiconductor device 100 and a corresponding land $230C_{11}$ of the printed wiring board 200C are bonded to each other via a corresponding solder bonding portion $190C_{11}$.

As illustrated in FIG. 10A, the solder resist 208C includes a side wall 2080C that defines an opening H3. Most of the land $230C_{11}$ is exposed by the opening H3.

The land $230C_{11}$ includes an edge portion 241C that is a first edge portion, and an edge portion 242C that is a second edge portion. When viewed from the Z direction, the edge portion 241C and the edge portion 242C face each other in the A1 direction, in which the straight line L1 extends while passing through the center of the semiconductor device 100. In addition, the land $230C_{11}$ includes an edge portion 243C that is a third edge portion, and an edge portion 244C that is a fourth edge portion. When viewed from the Z direction, the edge portion 243C and the edge portion 244C face each other in a direction in which the straight line L2 orthogonal to the straight line L1 extends. That is, the edge portion 243C and the edge portion 244C face each other in the A2 direction orthogonal to the A1 direction.

When viewed from the Z direction, the edge portions 241C and 242C of the land $230C_{11}$ do not overlap with the solder resist 208C. When viewed from the Z direction, one portion of the edge portion 243C and one portion of the edge portion 244C of the land $230C_{11}$ overlap with the solder resist 208C. Since one portion of the pair of the edge portions 243C and 244C is covered with the solder resist 208C, the land $230C_{11}$ is prevented from peeling off from the insulating substrate 220 of the printed wiring board 200C, by the solder resist 208C.

In addition, the edge portions 241C and 242C of the land $230C_{11}$ are exposed from the solder resist 208C. Thus, the solder bonding portion $190C_{11}$ is not in contact with both of edge portions 2081C and 2082C of the side wall 2080C of the solder resist 208C. The edge portions 2081C and 2082C of the side wall 2080C are formed in the A1 direction. With this structure, the thermal stress caused by the thermal deformation of the semiconductor device 100 can be prevented from locally concentrating on the solder bonding portion $190C_{11}$. As a result, the peeling and the fracture of the solder bonding portion $190C_{11}$ can be prevented. Therefore, the reliability of the processing module 300C improves.

EXAMPLES

Figure 11:
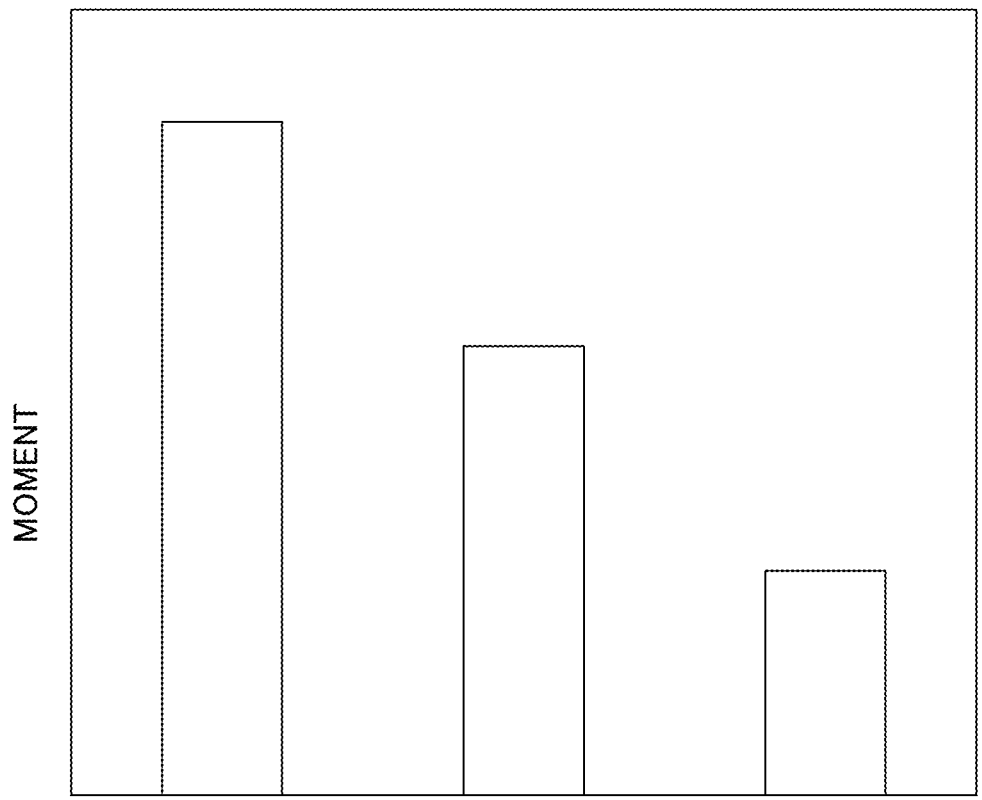
FIG. 11 is a graph illustrating experimental results in Example 1, Example 2, and Comparative Example 1.
Figure 11:
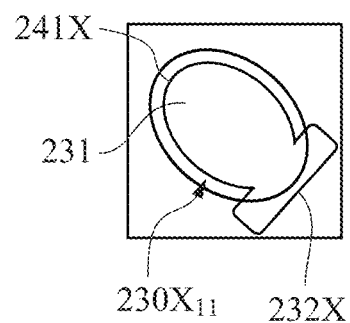
Figure 11:
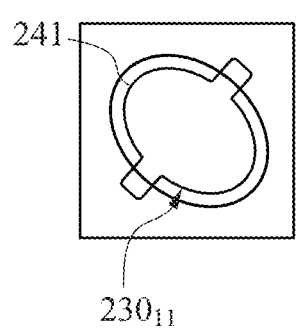
Figure 11:
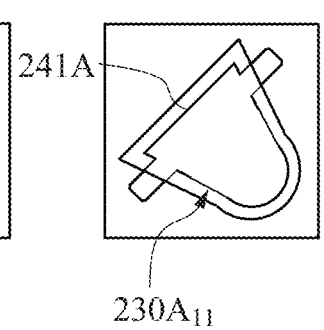

By using the processing module 300 of Example 1 of the first embodiment, the processing module 300A of Example 2 of the second embodiment, and a processing module of Comparative Example 1, an experiment was conducted. FIG. 11 is a graph illustrating results in the experiment. For convenience of description, FIG. 11 also illustrates a land $230X_{11}$ of Comparative Example 1, a land $230_{11}$ of Example 1, and a land $230A_{11}$ of Example 2. The vertical axis of the graph of FIG. 11 represents the moment applied to outer edge portions 241X, 241, and 241A of the lands $230X_{11}$, $230_{11}$, and $230A_{11}$ when corresponding digital cameras were dropped.

Before describing the experimental results, the processing module 300 of Example 1, the processing module 300A of Example 2, and the processing module of Comparative Example 1 will be described. Example 1 will be described with reference to FIGS. 2A, 2B, 3A, 3B, 4A, 4B, 5A, 5B, and 5C. In addition, Example 2 will be described with reference to FIGS. 7, 8A, and 8B.

Example 1

The structure of the processing module 300 of Example 1 is as follows. The semiconductor device 100 is a BGA semiconductor package, and the outer dimensions of the semiconductor device 100 is 18×18 mm. Each of the lands 130 has a diameter φ of 0.22 mm. The plurality of lands 130 is arranged in a staggered pattern, and a pitch of them is 0.4 mm. The material of the lands 130 is copper (Cu). The number of the terminals (lands) is 1860. The alloy composition of the solder bonding portions 190 is Sn—3.0 mass % Ag—0.5 mass % Cu.

The printed wiring board 200 has outer dimensions of 50×50 mm. The material of the insulating substrate 220 of the printed wiring board 200 is FR-4. The material of the lands 230 is copper (Cu). The thickness of the solder resist 208 is about 25 μm. The opening H1 has an elliptical shape with a major axis of 570 μm and a minor axis of 340 μm. The land body 231 of the land $230_{11}$ has an elliptical shape with a major axis of 470 μm and a minor axis of 240 μm. The distance between the edge portions 243 and 244 (which form a pair) of the pair of projecting portions 232 and 233 is 440 μm in the A2 direction. The width of the projecting portions 232 and 233 is 75 μm in the A1 direction.

Example 2

The structure of the processing module 300A of Example 2 is as follows. The semiconductor device 100 of Example 2 is the same as that of Example 1. The printed wiring board 200A of Example 2 is the same as the printed wiring board 200 of Example 1, except for the land $230A_{11}$ and the opening H2.

The opening H2 includes a first opening portion and a second opening portion. The first opening portion is semicircular, and has a center that is aligned with the center of the land $130_{11}$. The second opening portion is trapezoidal, and is formed downstream of the first opening portion in the A11 direction. The first opening portion has a semicircular shape with a radius of 170 μm. The second opening portion has a trapezoidal shape with a short side of 340 μm, a long side of 440 μm, and a length of 400 μm.

The land $230A_{11}$ includes the semicircular portion 231A-1 and the trapezoidal portion 231A-2. The semicircular portion 231A-1 has a semicircular shape with a radius of 120 μm. The trapezoidal portion 231A-2 has a trapezoidal shape with a short side of 240 μm, a long side of 340 μm, and a length of 350 μm.

The distance between the edge portions 243A and 244A (which form a pair) of the pair of projecting portions 232A and 233A is 540 μm in the A2 direction. The width of the projecting portions 232A and 233A is 75 μm in the A1 direction. The projecting portions 232A and 233A are disposed at a position separated from the edge portion 241A by 75 μm in a direction opposite to the A11 direction.

Comparative Example 1

Hereinafter, the features of the processing module of Comparative Example 1 different from those of the processing module of Example 1 will be described. In the land $230X_{11}$ of Comparative Example 1, a projecting portion 232X with a width of 100 μm is disposed, separated from a center portion of the elliptical land body 231 toward the center of the semiconductor device by 260 μm. Thus, the edge portion of the land $230X_{11}$ of Comparative Example 1 positioned closer to the center of the semiconductor device has an SMD structure.

By the way, since the semiconductor device and the printed wiring board are different in flexural rigidity, they bend differently when vibrating. Thus, when an electronic device is dropped, stress is produced by the impact of the drop, and causes a land of the printed wiring board to peel off. In this case, the stress tends to first peel a land positioned at an outermost portion of the semiconductor device. Thus, the position of an SMD structure of the land is important for preventing the peeling of the land. The stress that causes the outermost land to peel off is a moment (force) that is a product of a force caused by the bending of the printed wiring board and a distance between an outer edge portion of the land and a projecting portion of the land. The value of the force caused by the bending of the printed wiring board depends on drop direction, drop speed, overall structure of the semiconductor device, and overall structure of the printed wiring board. However, the value of the force hardly depends on the structure of the lands of the printed wiring board. Thus, the position of an SMD structure, or the position of a projecting portion is important for the land structure to suppress the peeling of lands caused by the impact of drop. This is because the moment that causes the land to peel off decreases as the distance between the outer edge portion and the projecting portion of the land is decreased.

In the experimental results illustrated in FIG. 11, the moment applied to the outer edge portion of the land is smaller in Example 1 and Example 2 than that in Comparative Example 1. In addition, the moment applied to the outer edge portion of the land is smaller in Example 2 than that in Example 1. Thus, Example 1 and Example 2 can suppress the peeling of lands caused by the impact of drop.

By the way, if the whole of the outer circumferential edge of a land has an SMD structure, the thermal stress applied to a solder bonding portion concentrates, in use of the electronic device, on two edge portions in the direction in which the straight line extends while passing through the center of the semiconductor device. As a result, a crack may occur at the two edge portions and develop, causing the fracture. Even if one of the two edge portions has an SMD structure and the other has an NSMD structure, a crack may occur at the SMD structure and develop.

Figure 12:
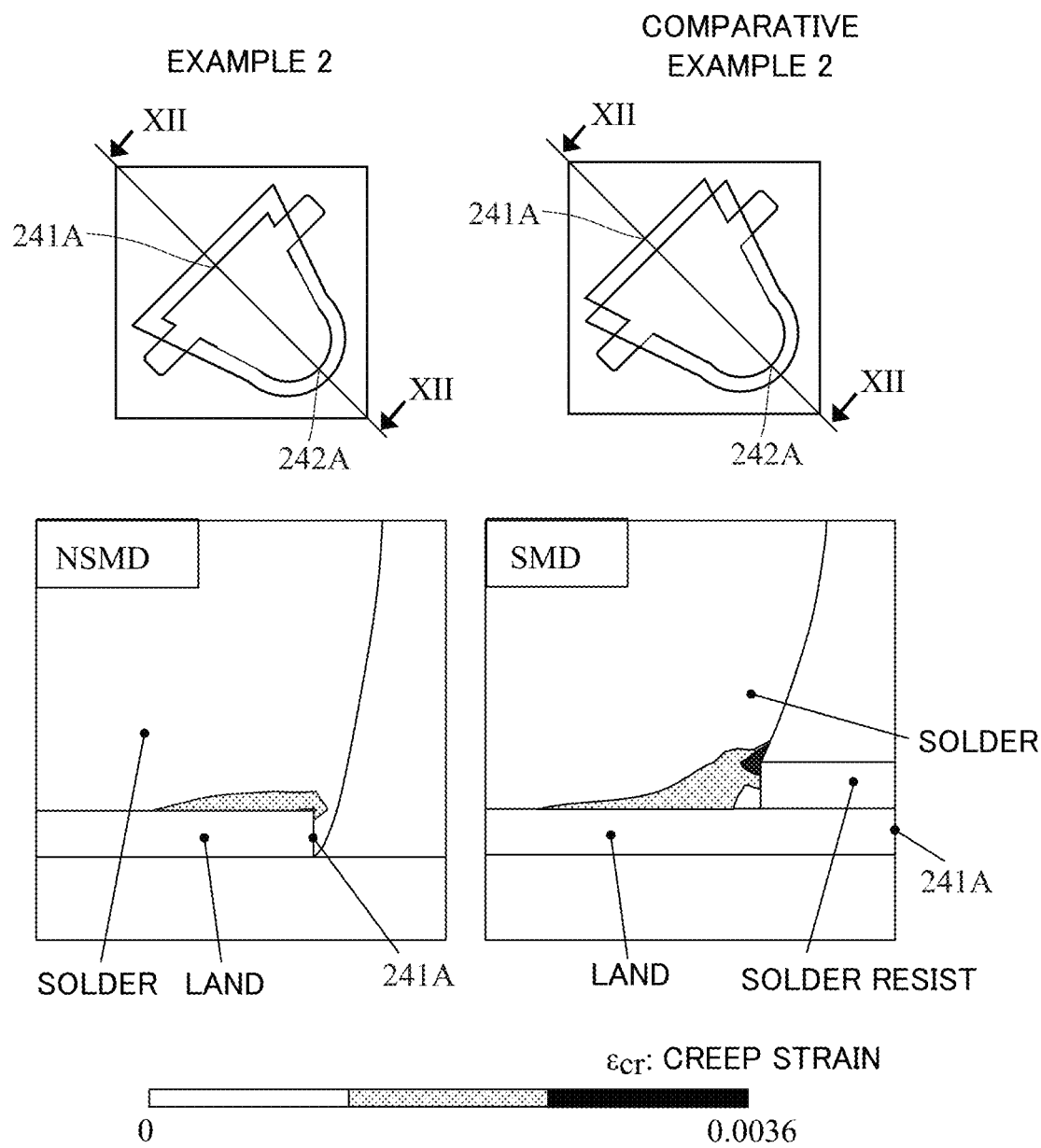
FIG. 12 is diagrams illustrating experimental results in Example 2 and Comparative Example 2.

FIG. 12 is diagrams illustrating experimental results in Example 2 and Comparative Example 2. In Comparative Example 2, the land has a shape in which a land of Example 2 is extended toward a direction extending away from the center of the semiconductor device, and the edge portion 241A of the land is covered with the solder resist. Thus, the edge portion 241A of Example 2 has an NSMD structure, and the edge portion 241A of Comparative Example 2 has an SMD structure. Note that both of the edge portion 242A of Example 2 and the edge portion 242A of Comparative Example 2 have an NSMD structure. FIG. 12 illustrates contour plots on creep strain applied, in use of the electronic device, to an edge portion of a solder bonding portion. Specifically, one contour plot of FIG. 12 illustrates a cross section of the NSMD structure, taken along a line XII-XII; and the other illustrates a cross section of the SMD structure, taken along a line XII-XII.

In the SMD structure, creep strain $\epsilon_{cr}$ applied to the solder has high values at an interface between the solder and the solder resist. Thus, the stress concentrates on a portion of the solder at which a crack tends to occur. In the NSMD structure, since there is no interface between the solder and the solder resist, the creep strain $\epsilon_{cr}$ applied to the solder generally has low values. Thus, the stress does not concentrate on the portion of the solder at which a crack tends to occur. Thus, in Example 2, since the two edge portions 241A and 242A have an NSMD structure, the reliability of the solder bonding increases in normal use of the electronic device.

The present invention is not limited to the above-described embodiments, and can be modified within a technical spirit of the present invention. In addition, the effects described in the embodiments are merely examples of the most suitable effects produced by the present invention. Thus, the effects of the present invention are not limited to the effects described in the embodiments.

In the above-described embodiments, the description has been made for the structure of a land of a printed wiring board, positioned at a corner portion of the semiconductor device in a plan view. The present disclosure, however, is not limited to the land positioned at the corner portion of the semiconductor device. For example, the outer lands $230_1$ of FIG. 4A except for the lands $230_{11}$ positioned at corner portions may have the same structure as that of the lands $230_{11}$. In addition, the outer lands $230_1$ of FIG. 7 except for the lands $230A_{11}$ positioned at corner portions may have the same structure as that of the lands $230A_{11}$.

In the above-described embodiments, the description has been made for the case where the semiconductor module is a processing module. The present disclosure, however, is not limited to this. For example, the semiconductor module may be the sensor module 900 of FIG. 1.

In the above-described embodiments, the description has been made for the case where all the lands positioned at the four corner portions have a combination of an SMD structure and an NSMD structure. The present disclosure, however, is not limited to this. Although it is preferable that all the four lands have the above-described structure, at least one of the four lands may have the above-described structure.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-117123, filed Jun. 25, 2019, which is hereby incorporated by reference herein in its entirety.

What is claimed is:

1. A semiconductor module comprising:
a printed wiring board; and
a semiconductor device mounted on the printed wiring board,
the printed wiring board comprising:
an insulating substrate;
a first land disposed on a main surface of the insulating substrate and bonded to the semiconductor device via solder; and
a second land disposed on the main surface of the insulating substrate and bonded to the semiconductor device via solder;
a solder resist disposed on the main surface of the insulating substrate and configured to cover one portion of each of the first land and the second land,
wherein the first land comprises a first edge portion, a second edge portion, a third edge portion, and a fourth edge portion,
wherein in a first direction, the first edge portion is positioned at one edge of the first land and the second edge portion is positioned at another edge of the first land, in the plan view,
wherein in a second direction orthogonal to the first direction, the third edge portion is positioned at one edge of the first land and the fourth edge portion is positioned at another edge of the first land, in the plan view, and
wherein in the plan view, the first edge portion and the second edge portion are configured not to overlap with the solder resist and the third edge portion and the fourth edge portion are configured to overlap with the solder resist,
wherein the second land is positioned inside with respect to the first land, in the plan view, and
wherein in the plan view, an area of a surface of the first land that does not overlap with the solder resist is larger than an area of a surface of the second land that does not overlap with the solder resist.

2. The semiconductor module according to claim 1, wherein the first land is positioned closer to an outer edge of the insulating substrate than the second land.

3. The semiconductor module according to claim 2, wherein in the plan view, the semiconductor device is rectangular and the first land is positioned in a vicinity of a corner portion of the semiconductor device.

4. The semiconductor module according to claim 3, wherein in the plan view, the first direction extends along a straight line passing through two opposite corners of the semiconductor device.

5. The semiconductor module according to claim 2, wherein, in the plan view, the first direction extends along a straight line passing through the first land and a center of the semiconductor device.

6. The semiconductor module according to claim 1, wherein the first land comprises a land body, a first projecting portion, and a second projecting portion,
wherein the first projecting portion comprises the third edge portion and extends from the land body in the second direction, and
wherein the second projecting portion comprises the fourth edge portion and extends from the land body in the second direction.

7. The semiconductor module according to claim 6, wherein in the plan view, the first projecting portion and the second projecting portion are positioned farther from the center of the semiconductor device than a center of the land body in the first direction.

8. The semiconductor module according to claim 6, wherein in the plan view, the land body is formed so as to widen toward a direction extending away from the center of the semiconductor device in the first direction.

9. The semiconductor module according to claim 1, wherein the semiconductor device comprises a third land bonded to the first land via solder, and
wherein in the plan view, a center of the first land is positioned farther from the center of the semiconductor device than a center of the third land in the first direction.

10. The semiconductor module according to claim 1, wherein the first land is a dummy terminal.

11. An electronic device comprising:
a housing; and
the semiconductor module according to claim 1,
wherein the semiconductor module is disposed in the housing.

12. A printed wiring board on which a semiconductor device is mounted, the printed wiring board comprising:
an insulating substrate;
a first land disposed on a main surface of the insulating substrate and bonded to the semiconductor device via solder;
a second land disposed on the main surface of the insulating substrate and bonded to the semiconductor device via solder; and
a solder resist disposed on the main surface of the insulating substrate and configured to cover one portion of each of the first lands and the second land,
wherein the first land comprises a first edge portion, a second edge portion, a third edge portion, and a fourth edge portion,
wherein in a first direction passing through the first edge portion and a center of a mounting area in which the semiconductor device is mounted, the first edge portion is positioned at one edge of the first land and the second edge portion is positioned at another edge of the first land, in the plan view,
wherein in a second direction orthogonal to the first direction, the third edge portion is positioned at one edge of the first land and the fourth edge portion is positioned at another edge of the first land, in the plan view,
wherein in the plan view, the first edge portion and the second edge portion are configured not to overlap with the solder resist and the third edge portion and the fourth edge portion are configured to overlap with the solder resist,
wherein the second land is positioned inside with respect to the first land, in the plan view, and
wherein in the plan view, an area of a surface of the first land that does not overlap with the solder resist is larger than an area of a surface of the second land that does not overlap with the solder resist.

13. A semiconductor module comprising:
a printed wiring board; and
a semiconductor device mounted on the printed wiring board, the printed wiring board comprising:

an insulating substrate;

a first land disposed on a main surface of the insulating substrate and bonded to the semiconductor device via solder;

a second land disposed on a main surface of the insulating substrate and bonded to the semiconductor device via solder; and a solder resist disposed on the main surface of the insulating substrate and configured to cover one portion of each of the first land and the second land, wherein the first land comprises a first edge portion, a second edge portion, a third edge portion, and a fourth edge portion, wherein in a first direction, the first edge portion is positioned at one edge of the first land and the second portion is positioned at another edge of the first land, in the plan view, wherein in a second direction orthogonal to the first direction, the third edge portion is positioned at one edge of the first land and the fourth edge portion is positioned at another edge of the first land, in the plan view, wherein in the plan view, the first edge portion and the second edge portion are configured not to overlap with the solder resist and the third edge portion and the fourth edge portion are configured to overlap with the solder resist, and wherein the first land comprises a land body and the first land comprises at least one of a first projecting portion and a second projecting portion.

14. The semiconductor module according to claim 13, wherein the second land is positioned inside with respect to the first land, in the plan view, and wherein in the plan view, an area of a surface of the first land that does not overlap with the solder resist is larger than an area of a surface of the second land that does not overlap with the solder resist.

15. An electronic device, comprising:

a housing; and the semiconductor module according to claim 13, wherein the semiconductor module is disposed in the housing.

16. The semiconductor module according to claim 13, wherein the first land comprises the land body, the first projecting portion, and the second projecting portion, wherein the first projecting portion comprises the third edge portion and extends from the land body in the second direction, and wherein the second projecting portion comprises the fourth edge portion and extends from the land body in the second direction.

* * * * *